United States Patent
Takano et al.

(10) Patent No.: US 8,642,987 B2
(45) Date of Patent: Feb. 4, 2014

(54) SEMICONDUCTOR DEVICE AND MANUFACTURING METHOD THEREOF

(75) Inventors: Tamae Takano, Atsugi (JP); Kiyoshi Kato, Atsugi (JP); Hideaki Kuwabara, Isehara (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 198 days.

(21) Appl. No.: 12/578,650

(22) Filed: Oct. 14, 2009

(65) Prior Publication Data

US 2010/0038618 A1 Feb. 18, 2010

Related U.S. Application Data

(63) Continuation of application No. 11/702,083, filed on Feb. 5, 2007, now Pat. No. 7,605,410.

(30) Foreign Application Priority Data

Feb. 23, 2006 (JP) .................................. 2006-047057

(51) Int. Cl.
*H01L 45/00* (2006.01)

(52) U.S. Cl.
USPC ............... 257/2; 257/154; 257/537; 257/168; 257/487; 257/E51.003; 257/E51.025; 257/E29.023; 257/213; 257/E45.002

(58) Field of Classification Search
USPC .......... 257/213, 154, 537, 168, 487, E51.003, 257/E51.025, E29.023, 296, 260, E45.002, 257/2
See application file for complete search history.

(56) References Cited

U.S. PATENT DOCUMENTS

| | | |
|---|---|---|
| 4,809,044 A | 2/1989 | Pryor et al. |
| 4,845,533 A | 7/1989 | Pryor et al. |
| 5,021,998 A | 6/1991 | Suzuki et al. |
| 5,206,665 A | 4/1993 | Kawade et al. |
| 5,389,475 A | 2/1995 | Yanagisawa et al. |
| 5,629,888 A | 5/1997 | Saito et al. |
| 6,034,882 A | 3/2000 | Johnson et al. |
| 6,288,437 B1 | 9/2001 | Forbes et al. |

(Continued)

FOREIGN PATENT DOCUMENTS

| | | |
|---|---|---|
| EP | 0269224 A | 6/1988 |
| EP | 0269225 A | 6/1988 |

(Continued)

OTHER PUBLICATIONS

Korean Office Action (Application No. 2012-0018642) Dated Oct. 29, 2013.

*Primary Examiner* — Matthew Reames
*Assistant Examiner* — Benjamin Tzu-Hung Liu
(74) *Attorney, Agent, or Firm* — Eric J. Robinson; Robinson Intellectual Property Law Office, P.C.

(57) ABSTRACT

The invention provides a novel memory for which process technology is relatively simple and which can store multivalued information by a small number of elements. A part of a shape of the first electrode in the first storage element is made different from a shape of the first electrode in the second storage element, and thereby voltage values which change electric resistance between the first electrode and the second electrode are varied, so that one memory cell stores multivalued information over one bit. By partially processing the first electrode, storage capacity per unit area can be increased.

13 Claims, 18 Drawing Sheets

(56) References Cited

U.S. PATENT DOCUMENTS

| | | | |
|---|---|---|---|
| 6,465,282 B1 | 10/2002 | Többen et al. | |
| 6,528,815 B1 | 3/2003 | Brown et al. | |
| 6,762,445 B2 * | 7/2004 | Ogawa et al. | 257/296 |
| 6,803,267 B1 | 10/2004 | Subramanian et al. | |
| 6,828,685 B2 | 12/2004 | Stasiak | |
| 6,844,268 B1 * | 1/2005 | Sugaya | 438/742 |
| 6,844,609 B2 | 1/2005 | Motsiff et al. | |
| 6,864,522 B2 | 3/2005 | Krieger et al. | |
| 6,903,958 B2 | 6/2005 | Bernds et al. | |
| 6,950,331 B2 | 9/2005 | Yang et al. | |
| 6,977,389 B2 | 12/2005 | Tripsas et al. | |
| 6,979,387 B2 | 12/2005 | Takeuchi et al. | |
| 6,979,880 B2 | 12/2005 | Bhattacharyya et al. | |
| 7,034,380 B2 | 4/2006 | Andideh | |
| 7,075,105 B2 | 7/2006 | Kano | |
| 7,087,975 B2 | 8/2006 | Lehmann | |
| 7,247,357 B2 | 7/2007 | Shiba et al. | |
| 7,254,059 B2 | 8/2007 | Li et al. | |
| 7,295,461 B1 * | 11/2007 | Krieger et al. | 365/158 |
| 7,358,590 B2 | 4/2008 | Yukawa et al. | |
| 2003/0119251 A1 * | 6/2003 | Aggarwal et al. | 438/239 |
| 2005/0006640 A1 | 1/2005 | Jackson et al. | |
| 2005/0179077 A1 * | 8/2005 | Schnitt | 257/306 |
| 2006/0077741 A1 | 4/2006 | Wang et al. | |
| 2006/0203533 A1 | 9/2006 | Kato et al. | |
| 2007/0249083 A1 | 10/2007 | Li et al. | |

FOREIGN PATENT DOCUMENTS

| | | | | |
|---|---|---|---|---|
| JP | 63-142690 A | | 6/1988 | |
| JP | 09-055476 A | | 2/1997 | |
| JP | 09-266253 A | | 10/1997 | |
| JP | 2001-189431 | * | 7/2001 | |
| JP | 2001189431 | * | 7/2001 | |
| JP | 2001189431 A | * | 7/2001 | H01L 27/10 |
| JP | 2001-345431 | | 12/2001 | |
| JP | 2002-026283 | | 1/2002 | |
| JP | 2005-010448 A | | 1/2005 | |
| JP | 2006-108645 A | | 4/2006 | |
| KR | 2006-0054659 A | | 5/2006 | |

* cited by examiner

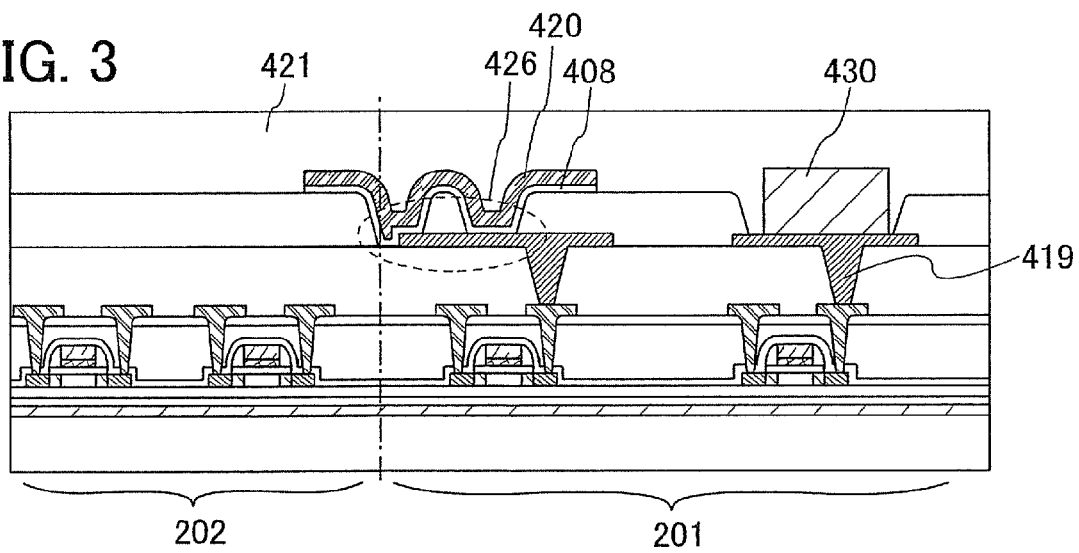

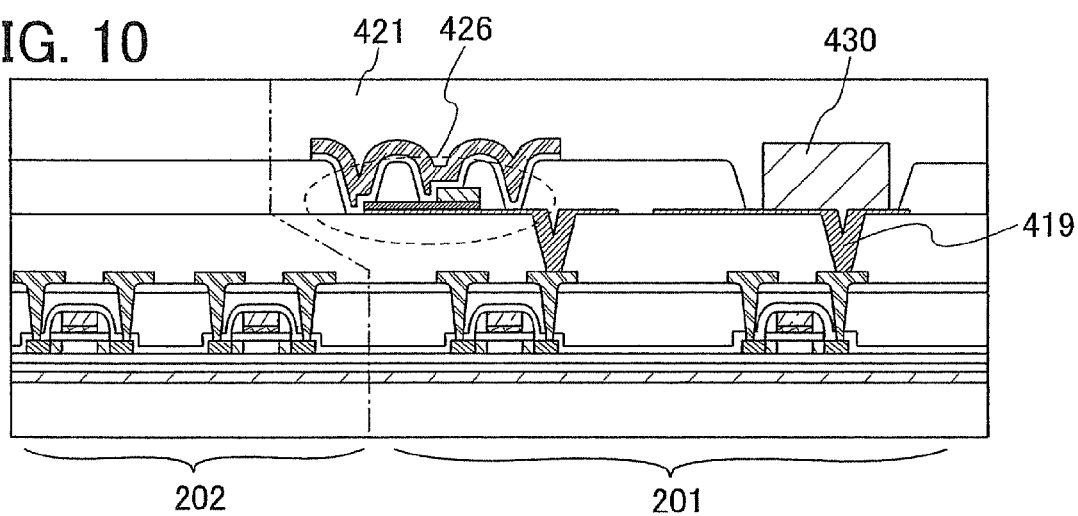

SEMICONDUCTOR DEVICE AND MANUFACTURING METHOD THEREOF

BACKGROUND OF THE INVENTION

1. Field of the Invention

The present invention relates to a semiconductor device which stores multivalued data. The present invention also relates to a semiconductor device including a circuit formed of a storage element and a thin film transistor (hereinafter referred to as TFT) and a manufacturing method thereof.

Note that in this specification, a semiconductor device refers to a device in general which functions by utilizing semiconductor characteristics. An electro-optic device, a semiconductor circuit, and an electronic apparatus are all semiconductor devices.

2. Description of the Related Art

In general, a storage device (also referred to as a memory device) includes a memory portion which stores data and a peripheral circuit (a driver, a decoder, a sense amplifier, or the like) for reading/writing data from/to the memory portion. In a conventional storage device, an area required to store one bit is larger than the size of one switching element (typically, a field effect transistor). Therefore, an area required to store one bit depends on processing technique for manufacturing a transistor, which prevents realization of a large-capacity storage device.

In recent years, as application software gets complex or the like, large capacity and high integration are highly demanded for a memory.

Patent Document 1 discloses a cell structure of a memory which is provided with an impedance phase change film formed of an organic material between electrodes. The memory has a structure where the film thickness of the organic material or contact areas with an electrode are varied in one memory cell, and a writing voltage is set at a plurality of impedance state transition points in hysteresis characteristics, so that information which can be stored in one memory cell can be made multi-valued.

[Patent Document 1]
Japanese Published Patent Application No. 2001-189431

SUMMARY OF THE INVENTION

The invention provides a novel memory capable of storing multivalued information with a small number of elements, which uses a relatively simple process technique.

One of the objects of the invention is to provide a storage device having a high integration degree per bit, that is, a storage device with low cost per bit. Another object of the invention is to provide a storage device with low power consumption by reducing the number of circuit elements and the number of wirings per bit.

In view of the foregoing problems, the invention provides a memory device in which a plurality of regions broken down (or changed) by a different voltage are formed in one memory cell and the memory cell is multivalued in the case where a memory element provided with a material layer between a pair of electrodes is formed and an operating method thereof.

Note that breakdown of a material layer of a memory element means that conductive layers (electrodes) which interpose the material layer of the memory element are short-circuited. As breakdown of a material layer of a memory element, dielectric breakdown is taken as an example. Further, a state of a material layer of a memory element is changed by heating to a glass transition temperature or higher to be softened or melted, and as a result, conductive layers which interpose the material layer of the memory element are short-circuited in some cases.

Note that a change of a material layer of a memory element means that electric characteristics of a material layer of a memory element is changed by applying a voltage. As an example, a phase change memory element which includes a material layer having electric characteristics to be reversibly changed by applying a voltage is given.

In the invention, a lower electrode is provided with a step, so that a corner (an edge) is formed; therefore, a voltage value which changes characteristics of a memory cell can be reduced by electric field concentration at a corner, thinning of an organic layer near the corner, or the like. In addition, the height of the step of the lower electrode or a cross sectional shape of the lower electrode is changed, so that a voltage value which changes characteristics of the memory cell can be changed by each region such as a region provided with a step or a region with a different cross sectional shape.

By utilizing characteristics described above, a plurality of regions each having a different voltage value which changes characteristics of a memory cell can be formed in the memory cell. That is, multivaluing operation (storing multivalued information) in which one memory cell stores more than one bit can be performed.

For example, a material layer of a memory element is divided into three regions: a first region, a second region, and a third region. An electrode in contact with the first region of the material layer of the memory element is provided with a first step. The electrode in contact with the second region is provided with a second step. The electrode in contact with the third region is not provided with a step. That is, a structure is that a first memory element is included in the first region, a second memory element is included in the second region, and a third memory element is included in the third region. The first step is larger than the second step. As the step gets higher, the material layer of the memory element, which is formed over the step, is broken down by a lower voltage value. The first region, the second region, and the third region are in order of increasing a breakdown voltage value of the material layer in the memory element in each region.

The invention is not limited to a memory structure in which an electrode is provided with a step, and various structures can be employed as long as a plurality of regions each having a different voltage value which changes characteristics of a memory cell can be formed. For example, when an electrode is provided with a step, there is a method of utilizing a difference between taper angles of steps other than a method of utilizing a difference of the height of steps. A breakdown voltage can be lowered when a step has a large taper angle, and a breakdown voltage can be increased when a step has a small taper angle. Steps having a different taper angle at a side surface of an electrode are formed in a memory cell, so that the memory cell can be multivalued as well. In addition, a difference between a step having an approximately perpendicular side surface and a step with a small taper angle can be utilized. Note that in this specification, a tapered shape refers to an angle equal to or larger than 5° and smaller than 85° with respect to a horizontal plane. A step having an approximately perpendicular side surface refers to that having an angle equal to or larger than 85° and equal to or smaller than 95° with respect to a horizontal plane.

In addition, a plurality of regions each having a different voltage value which changes characteristics of a memory cell may be formed by combining the structure in which an electrode is provided with a step and a structure with different taper angles.

In addition, a memory cell in the invention refers to one unit including a plurality of memory elements, a wiring (or a TFT), or the like. A plurality of memory cells are regularly arranged to form a memory portion of a semiconductor device.

In a structure 1 of the invention that is disclosed in this specification, a semiconductor device includes one memory cell which includes a first storage element and a second storage element. The first storage element and the second storage element include a common first electrode, a common second electrode, and a common material layer between the first electrode and the second electrode. In the semiconductor device, at least a part of a shape of the first electrode in the first storage element is different from a shape of the first electrode in the second storage element, and thereby voltage values which change electric resistance between the first electrode and the second electrode are varied, so that one memory cell stores multivalued information over one bit. By partially processing the first electrode, storage capacity per unit area can be increased.

In a conventional structure where the film thickness of an organic material varies in one memory cell, it is difficult to adjust the film thickness of the organic material accurately; therefore, it is difficult to reduce variation of a writing voltage in a plurality of memory cells. On the other hand, in the invention, only a part of the first electrode is required to be processed; therefore, variation of a writing voltage in a plurality of memory cells can be reduced as etching accuracy is higher as compared to the conventional structure.

Further, in a conventional structure where an electrode contact area is changed in one memory cell, the area is greatly increased; therefore, it is difficult to increase storage capacity per unit area. On the other hand, in the invention, increase of the area can be reduced as compared to the conventional structure; therefore, increase of storage capacity per unit area can be realized.

In the invention, a first electrode is electrically connected to a word line and a second electrode is electrically connected to a bit line, so that a passive matrix type storage portion can be formed. Further, a first electrode is connected to a switching element, so that an active matrix type storage portion can be formed. In a structure 2 of the invention, a semiconductor device includes a first storage element which includes a first electrode on an insulating surface, a material layer over the first electrode, and a second electrode over the material layer; and a second storage element adjacent to the first storage element. The first storage element and the second storage element have different voltage values which change electric resistance. The second electrode of the first storage element is common to the second storage element. The first storage element and the second storage element are electrically connected to the same thin film transistor. By electrically connecting a plurality of storage elements to the same thin film transistor, a driver circuit can be made small and reduction in size of the semiconductor device can be realized as compared to a semiconductor device including a passive matrix type storage portion.

A partition wall may be provided between a plurality of storage elements in one memory cell. In a structure 3 of the invention, a semiconductor device includes a first electrode on an insulating surface, a partition wall over the first electrode, a material layer over the first electrode and the partition wall, and a second electrode over the material layer. A portion of the partition wall is provided between a first region surrounded by a portion of the partition wall over the first electrode and a second region surrounded by a portion of the partition wall over an end portion of the first electrode. In the first region, at least the first electrode, the material layer, and the second electrode are overlapped with one another. In the second region, at least the material layer and the second electrode are overlapped with each other. By providing such a partition wall, even if a space between memory cells is narrowed, a defect such as a short circuit between adjacent memory cells can be prevented; therefore, high integration can be achieved and storage capacity per unit area can be increased.

A first electrode may have a stacked-layer structure of two or more layers in order that a part of the first electrode is easily processed. In a structure 4 of the invention, a semiconductor device includes a first electrode on an insulating surface, a partition wall over the first electrode, a material layer over the first electrode and the partition wall, and a second electrode over the material layer. The first electrode has a stacked-layer structure of two or more layers. In one memory cell, a first region surrounded by a portion of the partition wall over the first electrode, a second region where an end portion of a bottom layer of the first electrode and the material layer are overlapped with each other, and a third region where the material layer and an end portion of a top layer in the stacked layers of the first electrode are overlapped with each other are included. Portions of the partition wall are provided between the first region and the second region; the second region and the third region; and the first region and the third region; respectively. In the first region, at least the first electrode, the material layer, and the second electrode are overlapped with one another. In the second region, at least the material layer and the second electrode are overlapped with each other. The end portion of the bottom layer of the first electrode and the end portion of the top layer thereof are in different positions. By using the stacked-layer structure of two or more layers for the first electrode, even if a surface of the first electrode has a complex shape, the first electrode can be formed accurately by adjusting an etching condition and a material of the stacked layers, and variation of a writing voltage of a plurality of memory cells can be reduced.

Further, in the structure 3 or 4, the semiconductor device may also include a thin film transistor on the insulating surface, and the first electrode may be electrically connected to the thin film transistor to form an active matrix type storage portion. In addition, in the structure 3 or 4, the semiconductor device may include a thin film transistor and an antenna on the insulating surface, and the first electrode may be electrically connected to the thin film transistor and a circuit including the thin film transistor may be electrically connected to the antenna so that communication with a radio signal can be performed. As a circuit which is electrically connected to the antenna, a writing circuit, a reading circuit, a sense amplifier, an output circuit, a buffer, or the like is taken as an example.

Further, in each structure described above, the first electrode may include portions each having different film thickness and at least one step. Alternatively, the first electrode may include portions each having different film thickness and at least two side surfaces having different taper angles.

Further, in each structure described above, one memory cell may include a plurality of regions over the first electrode, and one memory cell can memorize a plurality of bits.

Further, in each structure described above, the material layer may include an organic compound. Thus, if another person disassembles the memory cell so as to commit forgery, forgery can be extremely difficult since an organic material is easily altered on exposure to air or the like so that the material is not easily identified.

As a material for the material layer of the memory element in the invention, a low molecular material, a high molecular material, a singlet material, a triplet material, or the like may be used. As the material for the material layer, a substance having a high hole transporting property can be used, for example, an aromatic amine-bases compound (namely, a compound having a bond of a benzene ring and nitrogen) such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4''-tris(N,N-diphenyl-amino)-triphenylamine (abbreviation: TDATA), 4,4',4''-tris[N-(3-methylphenyl)-N-phenyl-amino]-triphenylamine (abbreviation: MTDATA), or 4,4'-bis(N-(4-(N,N-di-m-tolylamino)phenyl)-N-phenylamino)biphenyl (abbreviation: DNTPD); a phthalocyanine compound such as phthalocyanine (abbreviation: $H_2Pc$), copper phthalocyanine (abbreviation: CuPc), or vanadyl phthalocyanine (abbreviation: VOPc), or the like can be used. Further, an organic compound material having a high electron transporting property can also be used, for example, a material formed of a metal complex or the like having a quinoline skeleton or a benzoquinoline skeleton such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq), a material formed of a metal complex or the like having an oxazole-based or thiazole-based ligand such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$), or the like can be used. Other than the metal complexes, a compound or the like such as 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), or bathocuproin (abbreviation: BCP) can be used. In addition, as the material layer, a material partially including an inorganic compound may be used as well as a material formed of only an organic compound material.

In order to prevent manipulation or unauthorized use of information, when an organic material or an inorganic material of which phase does not change reversibly is used for the material layer of the memory element, writing to a memory can be performed only once.

When an organic material (for example, bathophenanthroline (abbreviation: BPhen)) or an inorganic material (such as tellurium (Tel), tellurium oxide (TeOx), antimony (Sb), selenium (Se), or bismuth (Bi)), of which phase changes reversibly, is used as the material layer of the memory element for repetitive use, rewriting data to the memory can be performed multiple times. Further, a reader/writer may be able to write to and read from the memory element including an organic material.

According to the present invention, a memory element can be multivalued. That is, in a memory portion where a plurality of memory elements are arranged, storage capacity per unit area can be increased.

The memory element is multivalued, which enables high integration; therefore, the area of the memory element can be reduced.

In addition, the memory element in the invention can be formed over the same substrate where a circuit for controlling the memory element is formed through the same step that is a part of all steps; therefore, a semiconductor device including the memory element can be manufactured at low cost.

Further, the memory element in the invention can be provided over a resin substrate by using a separation method or a transfer method; therefore, a semiconductor device including the memory element can be made thinner and lighter and impact resistance thereof can be improved.

In addition, by forming the memory element in the invention and an antenna over the same resin substrate, the number of steps can be reduced and a semiconductor device having excellent impact resistance can be completed.

BRIEF DESCRIPTION OF DRAWINGS

FIG. 3 is a view showing a manufacturing step of a semiconductor device of the invention.

FIG. 10 is a view showing a manufacturing step of a semiconductor device of Embodiment Mode 3.

DETAILED DESCRIPTION OF THE INVENTION

Figure 1A:
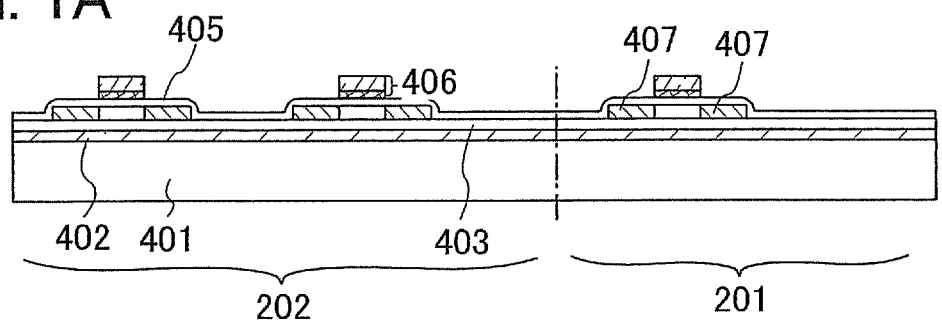
FIGS. 1A to 1D are views showing a manufacturing step of a semiconductor device of the invention.

Embodiment modes of the present invention will be hereinafter described with reference to drawings. However, the present invention can be embodied in many different modes and it is easily understood by those skilled in the art that the mode and detail can be variously changed without departing from the scope and spirit of the invention. Therefore, the present invention is not construed as being limited to description of the embodiment modes. Note that the same portions or portions having a similar function are denoted by the same reference numeral and description of such portions is omitted.

Embodiment Mode 1

In this embodiment mode, a method of manufacturing a semiconductor device including a memory element over a glass substrate as an insulating substrate is described. A method of forming a material layer of the memory element over an electrode step is described. Note that a mode in which the memory element and a circuit (a control circuit) for controlling the memory element are formed over the same substrate is shown.

First, as shown in FIG. 1A, a separation layer 402 is formed over a glass substrate 401. Quartz or the like is used for the insulating substrate as well as glass. As the separation layer 402, a film containing metal or a film containing silicon is formed entirely or selectively over the substrate. By at least selectively forming the separation layer, the glass substrate 401 can be peeled off later. As the metal, a single layer or stacked layers of an element selected from W, Ti, Ta, Mo, Nd, Ni, Co, Zr, Zn, Ru, Rh, Pd, Os, and Ir, or an alloy material or a compound material containing such metals as a main component can be used. As the compound material, oxide or nitride of such metal may be used. In addition, the state of a film containing silicon may be any of a crystalline state, an amorphous state, and a microcrystalline state. A speed to remove the separation layer 402 can be controlled in accordance with the state.

Next, an insulating layer 403 is formed so as to cover the separation layer 402. The insulating layer 403 is formed of silicon oxide, silicon nitride, or the like. Then, a semiconductor layer is formed over the insulating layer 403, and the semiconductor layer is crystallized by laser crystallization, thermal crystallization using a metal catalyst, or the like, and then patterned into a desired shape to form an island-shaped semiconductor layer. The laser crystallization may be performed by using a continuous wave laser or a pulsed laser. As the laser, one or more of the following can be used: an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser. For example, a pulsed excimer laser can be used. The semiconductor layer is formed to have a thickness of 0.2 μm or less, typically 40 to 170 nm, and preferably 50 to 150 nm. Note that for the semiconductor layer, an amorphous semiconductor, a microcrystalline semiconductor, an organic semiconductor, or the like may be used as well as a crystalline semiconductor. In addition, the semiconductor layer may be formed by using a material containing silicon, for example, by using a mixed material of silicon and germanium.

Next, a gate insulating layer 405 is formed so as to cover the semiconductor layer. The gate insulating layer 405 is formed using silicon oxide, silicon nitride, or the like. The gate insulating layer 405 may be formed by a CVD method, a thermal oxidation method, or the like. Alternatively, the semiconductor layer and the gate insulating layer 405 may be continuously formed by a CVD method, and subsequently can be patterned at the same time. In this case, impurity contamination at the boundary between each layer can be suppressed.

Then, a gate electrode layer 406 is formed. The gate electrode layer 406 is formed by using an element selected from tantalum (Ta), tungsten (W), titanium (Ti), molybdenum (Mo), aluminum (Al), and copper (Cu), or an alloy material or a compound material including such elements as a main component, and patterned into a desired shape. In the case of patterning by a photolithography method, the width of a gate electrode can be made narrower by using a resist mask of which width is narrowed by plasma etching or the like. Accordingly, performance of a transistor can be improved. The gate electrode layer 406 may have either a single-layer structure or a stacked-layer structure. FIG. 1A shows the case where the gate electrode layer 406 has a stacked-layer structure.

Next, impurity elements which imparts a conductivity type are added to the semiconductor layer to form an impurity region 407. The impurity region 407 is formed by using a resist mask formed by a photolithography method and adding an impurity element such as phosphorus, arsenic, or boron. With the impurity element, a polarity of either an n-channel type or a p-channel type can be determined.

Figure 1B:
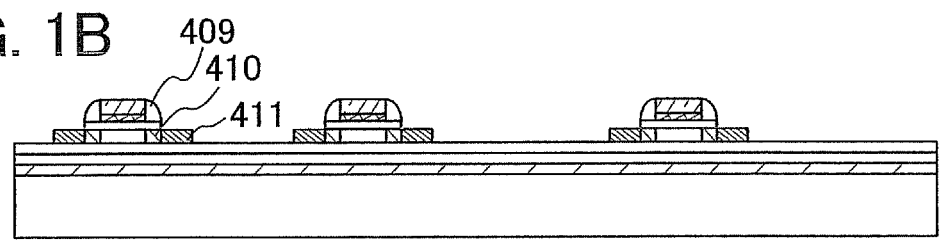

Then, as shown in FIG. 1B, an insulating layer is formed of an insulator containing silicon, for example, silicon nitride, and the insulating layer is anisotropically (perpendicularly) etched to form an insulating layer (also referred to as a sidewall) 409 which contacts with a side surface of the gate electrode. When the sidewall is formed, the gate insulating layer 405 might be etched.

Then, impurities are further added to the semiconductor layer to form a first impurity region 410 right under the insulating layer (sidewall) 409 and a second impurity region 411 having a higher concentration of impurities than the first impurity region 410. The structure having such impurity regions is called an LDD (Lightly Doped Drain) structure. When the first impurity region 410 is overlapped with the gate electrode layer 406, the structure is called a GOLD (Gate-drain Overlapped LDD) structure.

Figure 1C:
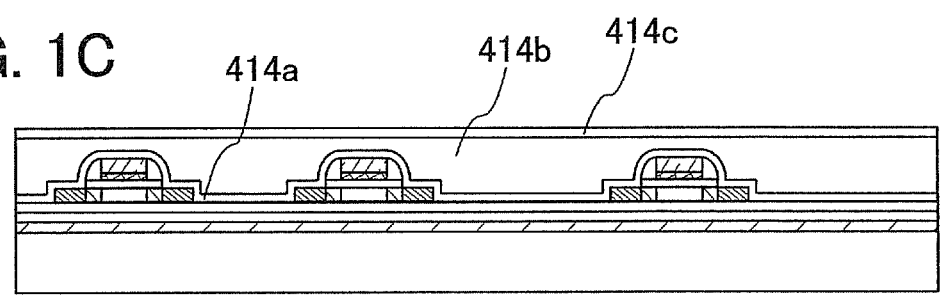

Then, as shown in FIG. 1C, an insulating layer is formed so as to cover the semiconductor layer and the gate electrode layer 406. The insulating layer is formed using an inorganic material, an organic material, or the like, which has an insulating property. As an inorganic material having an insulating property, silicon oxide, silicon nitride, or the like can be used. As an organic material having an insulating property, polyimide, acrylic, polyamide, polyimide amide, resist, benzocyclobutene, siloxane, or polysilazane can be used. Siloxane is a resin including a bond of silicon (Si) and oxygen (O) and has a skeleton structure formed by the bond of silicon (Si) and oxygen (O). As a substituent of the siloxane, an organic group containing at least hydrogen (for example, an alkyl group or aromatic hydrocarbon) is used. Alternatively, a fluoro group may be used as the substituent. Further alternatively, a fluoro group and an organic group containing at least hydrogen may be used as the substituent. Polysilazane is formed by using a polymer material having the bond of silicon (Si) and nitrogen (Ni) as a starting material.

FIG. 1C shows a mode where the insulating layer is formed to have a stacked-layer structure, and a first insulating layer 414a, a second insulating layer 414b, and a third insulating layer 414c are formed in this order from the bottom. The first insulating layer 414a is preferably formed by a plasma CVD method so as to contain much hydrogen since dangling bonds of the semiconductor layer can be reduced by hydrogen.

The second insulating layer 414b is preferably formed using an organic material since planarity can be improved. The third insulating layer 414c is preferably formed using an inorganic material in order to prevent discharge of moisture or the like from the second insulating layer 414b formed of an organic material or to prevent intrusion of moisture through the second insulating layer 414b.

Figure 1D:
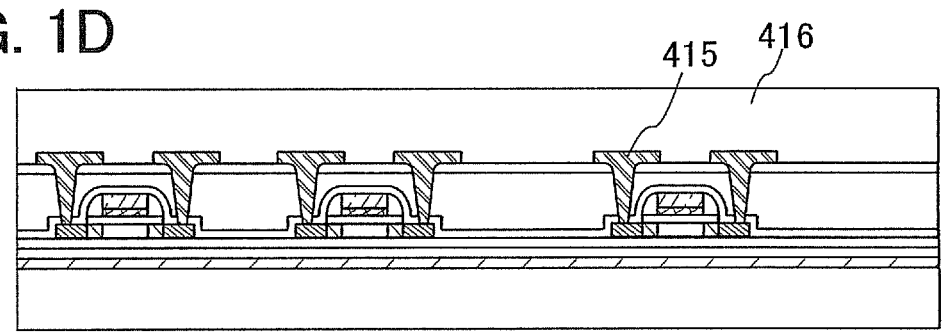

Then, a contact hole is formed in the insulating layer to expose the second impurity region 411, and as shown in FIG. 1D, a conductive layer 415 is formed so as to fill the contact hole. The conductive layer 415 includes a film formed of an element selected from aluminum (Al), titanium (Ti), molybdenum (Mo), and tungsten (W), an alloy film including such elements, an alloy film including such elements and silicon, or the like. Further, the conductive layer 415 can be formed to have a single-layer structure or a stacked-layer structure. After that, the conductive layer 415 is patterned into a desired shape, and a source electrode, a drain electrode, and other electrodes are formed at the same time.

In order to lower contact resistance between the source electrode and the drain electrode; and the second impurity region 411, a silicide may be formed on the impurity region. For example, a film including a metal element (typically, Ni) is formed on the second impurity region 411 and heated by a thermal annealing method using an annealing furnace, a laser annealing method, or a rapid thermal annealing method (RTA method). As a result, a silicide including the metal element and silicon is formed on the second impurity region; therefore, improvement in on current or mobility can be realized.

In this manner, thin film transistors are completed in a control circuit portion 202 and a memory element region 201. In the control circuit portion 202, a circuit (for example, a writing circuit, a reading circuit, a sense amplifier, an output circuit, a buffer or the like) is formed by using the thin film transistors.

Next, an insulating layer 416 is formed so as to cover the conductive layer 415. The insulating layer 416 may be formed using an inorganic material, an organic material, or the like which has an insulating property, and may have a single-layer structure or a stacked-layer structure. An inorganic material or an organic material similar to those of the first insulating layer 414a, the second insulating layer 414b, and the third insulating layer 414c can be used.

Figure 2A:
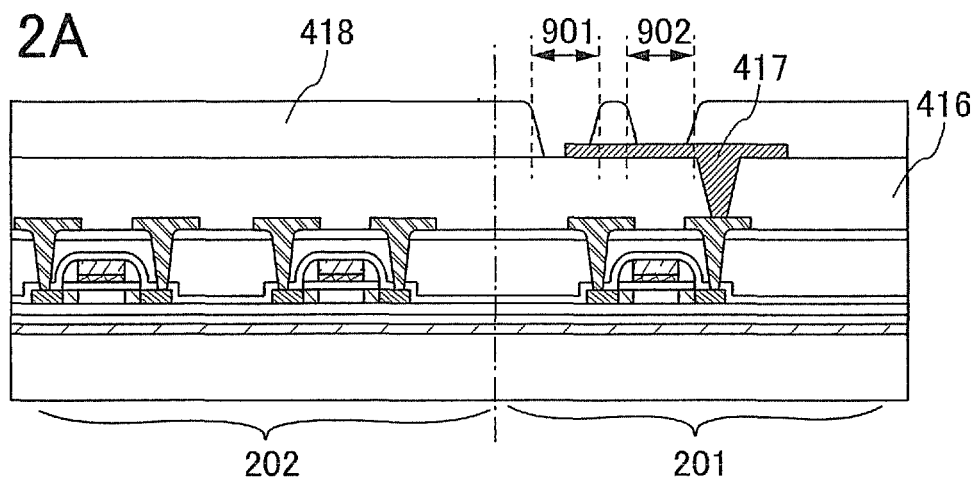
FIGS. 2A and 2B are views showing a manufacturing step of a semiconductor device of the invention.

Then, as shown in FIG. 2A, a contact hole is formed in the insulating layer 416 so as to expose the conductive layer 415, and a conductive layer 417 is formed so as to fill the contact hole. The conductive layer 417 may be formed to have a single-layer structure or a stacked-layer structure. The conductive layer 417 includes a film formed of an element selected from aluminum (Al), titanium (Ti), molybdenum (Mo), and tungsten (W), an alloy film including such elements, an alloy film including such elements and silicon, or the like. Alternatively, the conductive layer 417 may be formed by using a light transmitting material such as indium tin oxide (ITO), indium tin oxide containing silicon oxide, or indium oxide containing 2 to 20% of zinc oxide. After that, the conductive layer 417 is patterned into a desired shape. The patterned conductive layer 417 can function as a lower electrode of the memory element.

Although this embodiment mode shows the case where the lower electrode of the memory element is formed of the conductive layer 417, it may be formed of the conductive layer 415. That is, the conductive layer 415 to be a source electrode or a drain electrode of a thin film transistor may be used in common for the lower electrode of the memory element.

Next, an insulating layer is formed so as to cover the patterned conductive layer 417, and a plurality of openings are provided. FIG. 2A shows an example where two openings are provided. A partition wall 418 provided with an opening 902 which exposes the conductive layer 417 and covers an end portion of the conductive layer 417; and an opening 901 which exposes the conductive layer 417 and an end portion of the conductive layer 417 is formed. The partition wall 418 may be formed using an organic material, an inorganic material, or the like. An inorganic material or an organic material similar to those of the first insulating layer 414a, the second insulating layer 414b, and the third insulating layer 414c can be used. A side surface of the opening of the partition wall 418 is preferably tapered, which can prevent breakage of a thin film to be formed later.

Figure 2B:
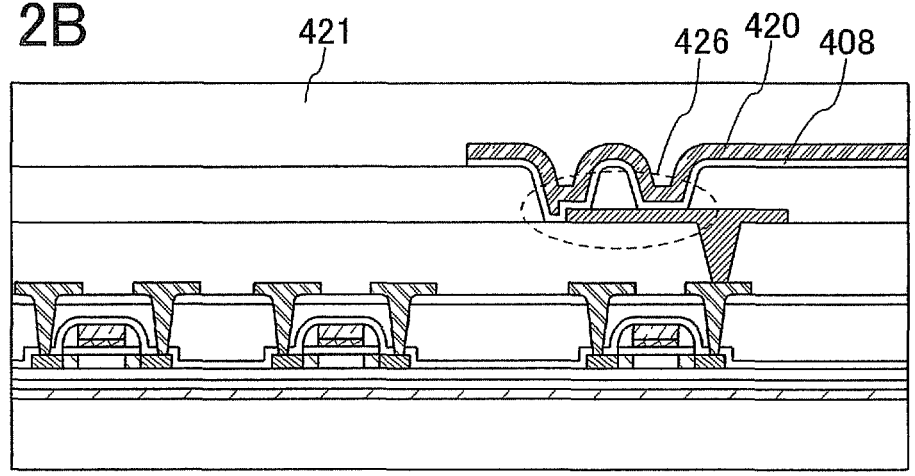

Next, as shown in FIG. 2B, a material layer 408 of the memory element is formed in the opening of the partition wall. The material layer 408 of the memory element can be formed by a vapor deposition method, a spin coating method, or a droplet discharging method typified by an ink-jet method.

Since the material layer 408 of the memory element can also be formed using the same material as an electroluminescent layer included in a light emitting element, the memory element and the light emitting element can be formed through a common step. As the light emitting element, an organic EL element using a layer including an organic compound as the electroluminescent layer or an inorganic EL element using an inorganic material as an illuminant can be used. That is, a memory device having a display function can be formed.

Next, a conductive layer to be an opposite electrode 420 is formed. Since the opposite electrode 420 can be formed over the whole surface of the memory element region, patterning by a photolithography method is not required. Needless to say, the opposite electrode 420 may be selectively formed by patterning. The opposite electrode 420 can function as an upper electrode of the memory element.

Thus, a memory element 426 including the conductive layer 417, the material layer 408 of the memory element, and the opposite electrode 420 is formed.

More preferably, an insulating layer 421 functioning as a protective film is formed. In order to improve impact resistance, the insulating layer 421 is preferably formed thick. Therefore, the insulating layer 421 is preferably formed using an organic material such as an epoxy resin or a polyimide resin. In addition, a drying agent is preferably dispersed in the insulating layer 421 in order to provide a hygroscopic property. This is because intrusion of moisture can be prevented particularly in the case where the material layer of the memory element is formed using an organic material. By sealing with the insulating layer 421 in this manner, intrusion of unnecessary oxygen as well as moisture can be prevented.

In this manner, a circuit including the thin film transistors which are provided in the control circuit portion 202 can be formed, and the memory element 426 which is formed over the same substrate as the circuit through a common step to that of the circuit and provided in the memory element region 201, and a thin film transistor connected to the memory element 426 can be formed. The memory element is controlled by the thin film transistor. In this manner, a mode where a thin film transistor is connected to a memory element is called an active matrix type.

In the memory device of the invention, the memory element 426 and the control circuit can be formed over the same substrate through a common step; therefore, manufacturing cost can be reduced. Further, since a step of mounting a memory element formed by a conventional IC is not required, a connection defect with the control circuit can be prevented.

FIG. 3 shows a mode where an antenna 430 for supplying power or the like to the memory element 426 is provided. This embodiment mode shows a mode where the antenna 430 is formed in the opening provided in the partition wall.

The antenna 430 can be formed so as to be connected to an electrode 419 which is electrically connected to a thin film transistor provided in the memory element region 201. As a conductive material for the antenna, an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material including such elements as a main component can be used. The conductive layer is formed to have a single-layer structure or a stacked-layer structure. As the conductive material for the antenna, a low-resistance material such as Cu (copper), Ag (silver), or Al (aluminum) is preferably used. Further, the antenna 430 is preferably formed to be thick in order to lower the resistance thereof. The antenna 430 can be formed by a vapor deposition method, a printing method, a plating method, or a droplet discharging method typified by an ink-jet method.

By forming the antenna 430 and the thin film transistor over the same substrate in this manner, wireless communication with a reader/writer device can be performed. As a result, multivalued information can be obtained from the memory element 426 without breakdown. For example, when an electromagnetic coupling method or an electromagnetic induction method (for example, a 13.56 MHz band) is employed as a signal transmission method of the semiconductor device, electromagnetic induction caused by a change in magnetic field density is used. Therefore, the conductive layer functioning as an antenna is formed in an annular shape (for example, a loop antenna) or a spiral shape (for example, a spiral antenna). Further, when a microwave method (for example, a UHF band (860 to 960 MHz band), a 2.45 GHz band, or the like) is employed as the signal transmission method of the semiconductor device, the shape such as a length of the conductive layer functioning as the antenna may be set as appropriate in consideration of a wavelength of an electromagnetic wave used for signal transmission. For example, the conductive layer functioning as the antenna can be formed in a linear shape (for example, a dipole antenna), a flat shape (for example, a patch antenna), a ribbon-like shape, or the like. The shape of the conductive layer functioning as the antenna is not limited to a linear shape, and the conductive layer functioning as the antenna may be formed in a curved-line shape, a meandering shape, or a combination thereof, in consideration of a wavelength of an electromagnetic wave.

Figure 4A:
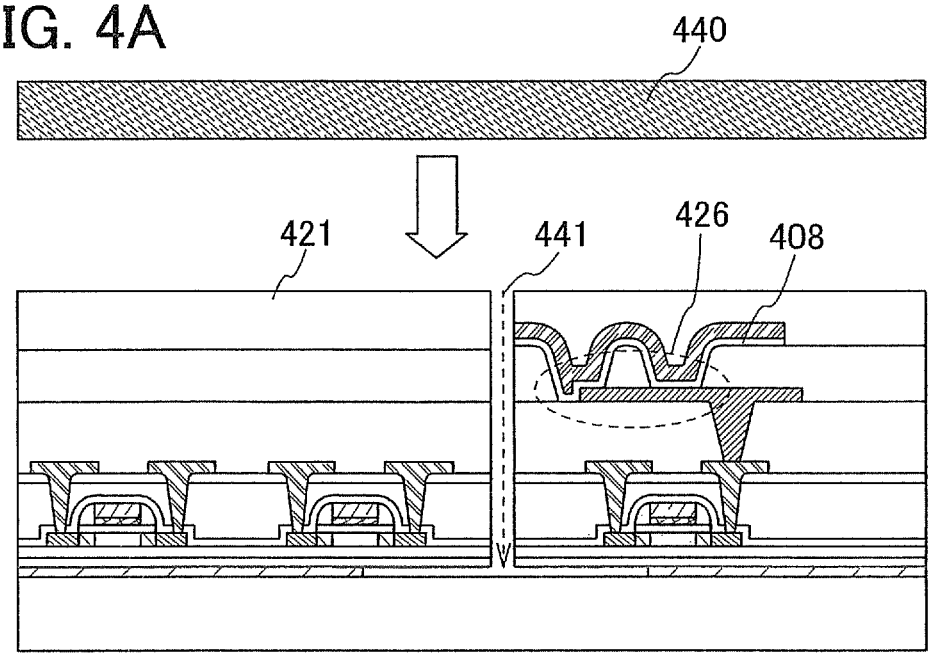
FIGS. 4A and 4B are views showing a manufacturing step of a semiconductor device of the invention.

Although a semiconductor device provided with the memory element region and the antenna can be completed through the aforementioned steps, a groove may be formed thereafter as shown in FIG. 4A, and an etchant 441 may be introduced into the groove so that the glass substrate 401 is peeled off. At this time, a resin substrate 440 attached onto the insulating layer 421 is preferably used as a supporting base in order to easily peel off the glass substrate 401. Note that the resin substrate 440 may be attached by using an adhesion function of the insulating layer 421. The resin substrate 440 may be formed using plastic typified by polyethylene terephthalate (PET), polyethylene naphthalate (PEN), or polyethersulfone (PES); or a synthetic resin such as acrylic. Since such a resin substrate is quite thin, it has flexibility. Therefore, the glass substrate 401 can be sequentially peeled off by attaching the rolled up resin substrate 440 onto the insulating layer 421. Such a step is suitable for mass production.

The etchant 441 is not specifically limited to a certain type as long as the separation layer 402 can be selectively etched. For example, a halogen compound may be used. When amorphous silicon or tungsten is used for the separation layer, $ClF_3$ (chlorine trifluoride) can be used as the etchant. In addition, when silicon oxide is used for the separation layer, HF (hydrogen fluoride) can be used as the etchant.

The invention is not limited to a separation method where a separation layer is selectively etched by an etchant, and other known separation methods may be employed as well. For example, a metal oxide film (for example, a tungsten oxide film or a molybdenum oxide film) may be provided between an integrated circuit and a substrate having high heat resistance, and after the metal oxide film is weakened, the integrated circuit including a TFT provided over the metal oxide film can be peeled. Alternatively, at least a part of a separation layer may be destroyed by irradiation with laser light, so that the integrated circuit including a TFT can be peeled off from a substrate.

Figure 4B:
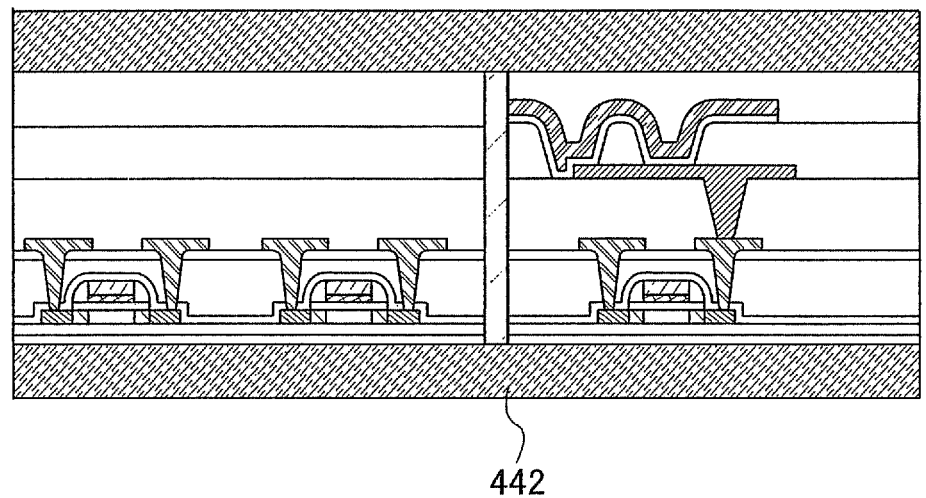

Then, as shown in FIG. 4B, a resin substrate 442 is attached instead of the peeled glass substrate 401. Note that the resin substrate 442 may be formed using a material similar to that of the resin substrate 440.

As a result of peeling off the glass substrate 401 in this manner, reduction in thickness and weight of a semiconductor device including the memory element can be achieved and flexibility and impact resistance thereof can be improved.

Further, the substrate is divided into a plurality of semiconductor devices each including a memory element. As a result, cost reduction of the semiconductor device including the memory element can be achieved.

Further, a protective layer such as a gas barrier layer may be provided on each surface of the resin substrates 440 and 442. The provision of the protective layer can prevent intrusion of oxygen and alkaline elements, and thereby reliability can be improved. The protective layer is formed using an inorganic material containing nitrogen, such as an aluminum nitride film or a silicon nitride film.

Although this embodiment mode shows a mode where the glass substrate 401 is removed and the resin substrates 440 and 442 are attached, the invention is not limited to this. Note that reduction in weight and thickness of the semiconductor device including the memory element can be achieved by removing the glass substrate 401.

Although a thin film transistor in this embodiment mode has a stacked-layer structure where a semiconductor layer, a gate insulating layer, and a gate electrode layer are sequentially stacked over a substrate, the thin film transistor used in the invention is not limited to have this structure, and such a structure may be adopted, in which a gate electrode layer, an insulating layer, and a semiconductor layer are stacked in this order. Further, although the thin film transistor has impurity regions such as the first impurity region (also referred to as a low concentration impurity region) 410 and the second impurity region (also referred to as a high concentration impurity region) 411, the invention is not limited to these, and a single-drain structure having a uniform concentration of impurities may be adopted as well.

In addition, a multilayer structure may be adopted where a plurality of thin film transistors shown in this embodiment mode are stacked. When such a multilayer structure is employed, a low dielectric constant (low-k) material is preferably used as a material of an insulating layer in order to reduce parasitic capacitance which is generated in the insulating layer between the stacked thin film transistors. For example, in addition to the aforementioned materials, a resin material such as an epoxy resin or an acrylic resin, or an organic material such as siloxane may be used. By employing the multilayer structure which reduces parasitic capacitance, reduction of area, high-speed operation and low power consumption of the memory device can be achieved.

In this manner, in the invention, a memory cell can be multivalued in one memory cell. Thus, storage capacity of a memory region of the semiconductor device can be increased.

Embodiment Mode 2

In this embodiment mode, a method of forming a memory element over a glass substrate as an insulating substrate is described. An electrode is formed of a stacked film and the memory element is formed over a plurality of electrode steps. Note that a mode in which the memory element and a circuit (a control circuit) for controlling the memory element are formed over the same substrate through a common step is shown. In addition, parts of the steps same as Embodiment Mode 1 are described using the same drawings and the same reference numerals.

First, in the same manner as in FIG. 1A, the separation layer 402 is formed over the glass substrate 401. Quartz or the like is used for the insulating substrate as well as glass. The separation layer 402 is obtained by forming a film containing metal or a film containing silicon entirely or selectively over the substrate.

Next, in the same manner as in Embodiment Mode 1, the insulating layer 403 is formed so as to cover the separation layer 402. The insulating layer 403 is formed of silicon oxide, silicon nitride, or the like. Then, the semiconductor layer is formed over the insulating layer 403 and crystallized by laser crystallization, thermal crystallization using a metal catalyst, or the like, and then patterned into a desired shape to form the island-shaped semiconductor layer. The laser crystallization may be performed by using a continuous wave laser or a pulsed laser.

Next, in the same manner as in Embodiment Mode 1, the gate insulating layer 405 is formed so as to cover the semiconductor layer. The gate insulating layer 405 is formed using silicon oxide, silicon nitride, or the like. The gate insulating layer 405 can be formed by a CVD method, a thermal oxidation method, or the like. Alternatively, the semiconductor layer and the gate insulating layer 405 may be continuously formed by a CVD method, and subsequently can be patterned at the same time. In this case, impurity contamination at the boundary between each layer can be suppressed.

Then, in the same manner as in Embodiment Mode 1, the gate electrode layer 406 is formed. The gate electrode layer 406 is formed using an element selected from tantalum (Ta), tungsten (W), titanium (Ti), molybdenum (Mo), aluminum (Al), and copper (Cu), or an alloy material or a compound material including such elements as a main component, and patterned into a desired shape. In the case of patterning by a photolithography method, the width of the gate electrode can be made narrower by using a resist mask of which width is narrowed by plasma etching or the like. Accordingly, performance of a transistor can be improved. The gate electrode layer 406 may have either a single-layer structure or a stacked-layer structure.

Next, in the same manner as in Embodiment Mode 1, impurity elements which imparts a conductivity type are added to the semiconductor layer to form the impurity region 407. The impurity region 407 is formed by using a resist mask formed by a photolithography method and adding an impurity element such as phosphorus, arsenic, or boron. With the impurity element, a polarity of either an n-channel type or a p-channel type can be determined.

Then, in the same manner as in Embodiment Mode 1, as shown in FIG. 1B, the insulating layer is formed of an insulator containing silicon, for example, silicon nitride, and the insulating layer is anisotropically (perpendicularly) etched to form the insulating layer (also referred to as the sidewall) 409 which contacts with a side surface of the gate electrode. When the sidewall is formed, the gate insulating layer 405 might be etched.

Next, in the same manner as in Embodiment Mode 1, impurities are further added to the semiconductor layer to form the first impurity region 410 right under the insulating layer (sidewall) 409 and the second impurity region 411 having a higher concentration of impurities than the first impurity region 410.

Then, in the same manner as in Embodiment Mode 1, the insulating layer is formed so as to cover the semiconductor layer and the gate electrode layer 406. The insulating layer is formed using an inorganic material, an organic material, or the like, which has an insulating property. As an inorganic material having an insulating property, silicon oxide, silicon nitride, or the like can be used. As an organic material having an insulating property, polyimide, acrylic, polyamide, polyimide amide, resist, benzocyclobutene, siloxane, or polysilazane can be used.

Here, similarly to FIG. 1C, a mode where the insulating layer is formed to have a stacked-layer structure is shown, and the first insulating layer 414a, the second insulating layer 414b, and the third insulating layer 414c are formed in this order from the bottom. The first insulating layer 414a is preferably formed by a plasma CVD method so as to contain much hydrogen since dangling bonds of the semiconductor layer can be reduced by hydrogen. The second insulating layer 414b is preferably formed using an organic material since planarity can be improved. The third insulating layer 414c is preferably formed using an inorganic material in order to prevent discharge of moisture or the like from the second insulating layer 414b formed of an organic material or to prevent intrusion of moisture through the second insulating layer 414b.

Next, the contact hole is formed in the insulating layer to expose the second impurity region 411, and similarly to FIG. 1D, the conductive layer 415 is formed so as to fill the contact hole. The conductive layer 415 includes a film formed of an element selected from aluminum (Al), titanium (Ti), molybdenum (Mo), and tungsten (W), an alloy film including such elements, an alloy film including such elements and silicon, or the like. Further, the conductive layer 415 can be formed to have a single-layer structure or a stacked-layer structure. After that, the conductive layer 415 is patterned into a desired shape, and a source electrode, a drain electrode, and other electrodes are formed at the same time.

In order to lower contact resistance between the source electrode and the drain electrode; and the second impurity region 411, a silicide may be formed on the impurity region. For example, a film including a metal element (typically, Ni) is formed on the second impurity region 411 and heated by a thermal annealing method using an annealing furnace, a laser annealing method, or a rapid thermal annealing method (RTA method). As a result, a silicide including the metal element and silicon is formed on the second impurity region; therefore, improvement in on current or mobility can be realized.

In this manner, the thin film transistors are completed in the control circuit portion 202 and the memory element region 201. In the control circuit portion 202, a circuit is formed by using the thin film transistors.

Next, in the same manner as in Embodiment Mode 1, the insulating layer 416 is formed so as to cover the conductive layer 415. The insulating layer 416 may be formed using an inorganic material, an organic material, or the like which has an insulating property, and may have a single-layer structure or a stacked-layer structure. An inorganic material or an organic material similar to those of the first insulating layer 414a, the second insulating layer 414b, and the third insulating layer 414c can be used for the insulating layer 416.

Figure 5A:
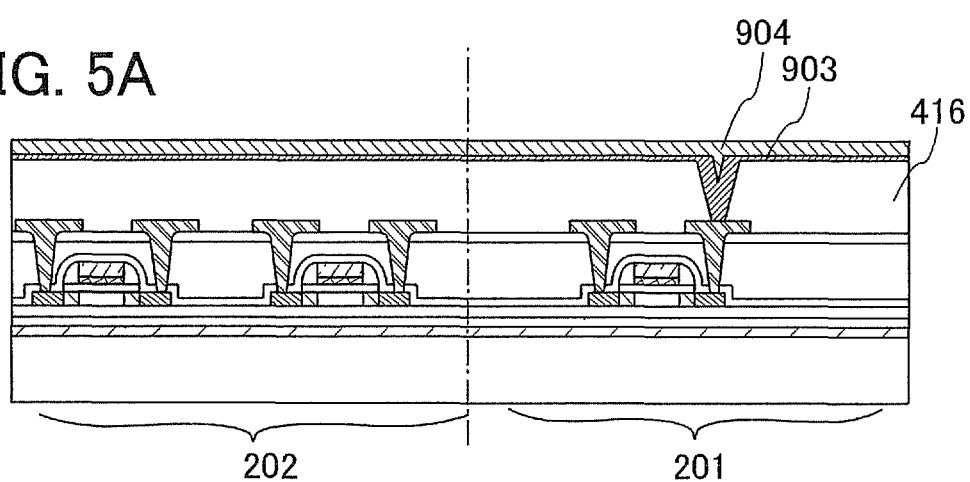
FIGS. 5A and 5B are views showing a manufacturing step of a semiconductor device of Embodiment Mode 2.
Figure 5B:
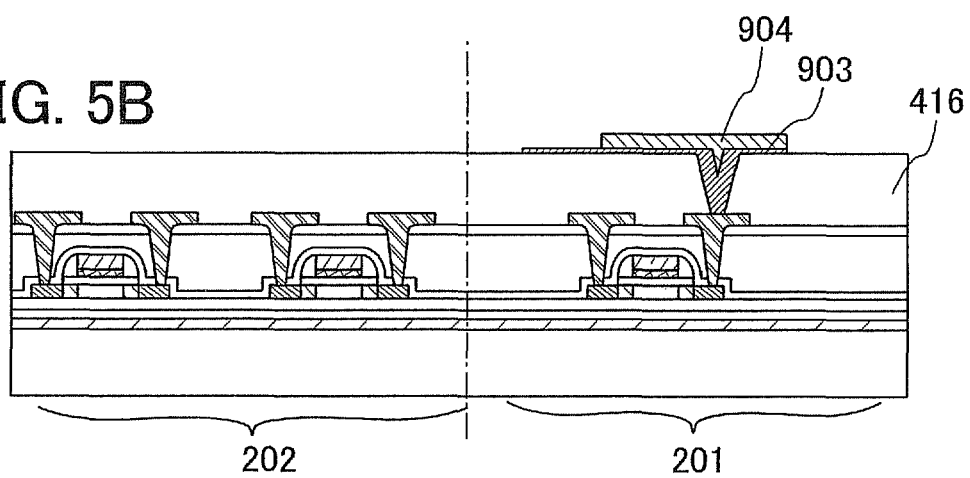

After that, as shown in FIG. 5A, the insulating layer 416 is selectively etched to form a contact hole so that the conductive layer 415 is exposed, and conductive layers 903 and 904 are stacked so as to fill the contact hole. Each of the conductive layers 903 and 904 includes a film formed of an element selected from aluminum (Al), titanium (Ti), molybdenum (Mo), and tungsten (W), an alloy film including such elements, an alloy film including such elements and silicon, or the like. Alternatively, the conductive layers 903 and 904 may be formed by using a light transmitting material such as indium tin oxide (ITO), indium tin oxide containing silicon oxide, or indium oxide containing 2 to 20% of zinc oxide. In FIG. 5A, titanium is used for the conductive layer 903 and aluminum is used for the conductive layer 904. The conductive layer 904 is made thicker than the conductive layer 903, so that two steps having different height can be provided. The method is described below.

As shown in FIG. 51B, the conductive layers 903 and 904 are processed into a desired shape. The conductive layers 903 and 904 are processed so as to expose a surface of the conductive layer 904. The conductive layer 904 is made thicker than the conductive layer 903, so that two steps having different height are provided. It is considered that the higher a step is, the lower a breakdown voltage of the memory element is. Therefore, by providing two steps having different height with the use of the lower electrode, two memories having a different breakdown voltage of the memory element can be formed. That is, the conductive layers 903 and 904 can function as the lower electrodes of the memory element and also as the steps for adjusting the breakdown voltage of the memory element.

Figure 6A:
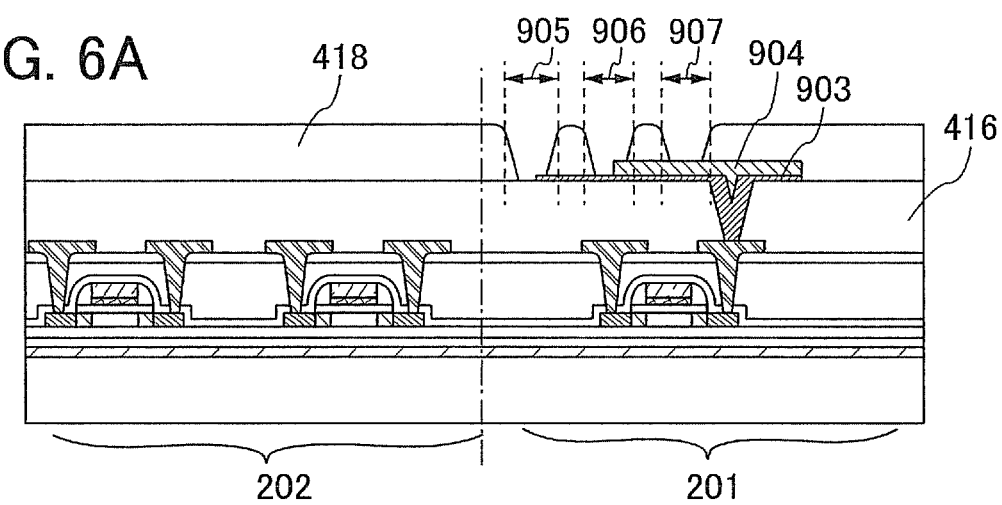
FIGS. 6A and 6B are views showing a manufacturing step of a semiconductor device of Embodiment Mode 2.

Next, as shown in FIG. 6A, an insulating layer is formed so as to cover the conductive layers 903 and 904, and a plurality of openings are provided. The partition wall 418 provided with openings 905, 906, and 907 is formed.

As described above, a plurality of openings and the conductive layer having a plurality of steps can be formed.

Note that although this embodiment mode shows the case where the lower electrode of the memory element is formed of the conductive layers 903 and 904, the conductive layer 415 to be a source electrode or a drain electrode of a thin film transistor may be used in common for the lower electrode of the memory element.

Figure 6B:
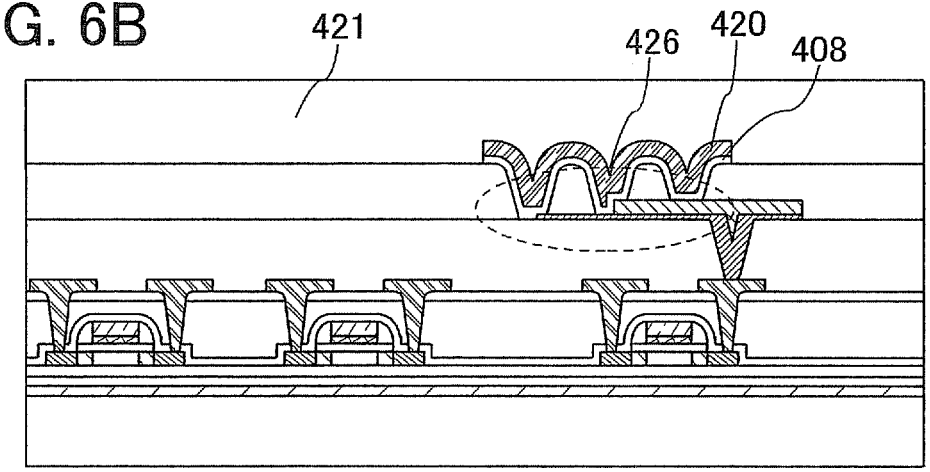

Next, as shown in FIG. 6B, the material layer 408 of the memory element is formed in the opening of the partition wall. The material layer 408 of the memory element can be formed by a vapor deposition method, a spin coating method, or a droplet discharging method typified by an ink-jet method.

Since the material layer 408 of the memory element can also be formed using the same material as the electroluminescent layer included in the light emitting element, the memory element and the light emitting element can be formed through a common step. That is, a memory device having a display function can be formed.

Next, the conductive layer to be the opposite electrode 420 is formed. Since the opposite electrode 420 can be formed over the whole surface of the memory element region, patterning by a photolithography method is not required. Needless to say, the opposite electrode 420 may be selectively formed by patterning. The opposite electrode 420 can function as the upper electrode of the memory element.

Thus, the memory element 426 including the conductive layer 417, the material layer 408 of the memory element, and the opposite electrode 420 is formed. In one memory cell, three memory elements corresponding to the three openings 905, 906, and 907 are formed, and this memory cell has three voltage values by which electric resistance is changed. This voltage value by which electric resistance is changed corresponds to a reading voltage value (or a reading current value) or a writing voltage value (or a writing current value).

Change of a reading current value of a manufactured memory having a plurality of openings is described in detail by using formulae. A resistance value of the material layer in the memory before a short circuit is denoted by Ra. Contact resistance of the opposite electrode and the lower electrode after the short circuit is denoted by R1, R2, and R3 with respect to the openings 905, 906, and 907, respectively. A voltage applied to the memory element when reading is performed is denoted by Vr. A reading current value before writing is expressed by Formula 1.

$$I0 = \frac{Vr}{(Ra+R1)} + \frac{Vr}{(Ra+R2)} + \frac{Vr}{(Ra+R3)} \approx \frac{3Vr}{Ra} \quad \text{[Formula 1]}$$

Note that approximation is performed on the assumption that Ra>>R1, R2, R3 is satisfied. When first writing is preformed, a short circuit is caused between the opposite electrode and the lower electrode at the opening 906. A reading current value I1 after the short circuit is expressed by Formula 2.

$$I1 = \frac{Vr}{(Ra+R1)} + \frac{Vr}{R2} + \frac{Vr}{(Ra+R3)} \approx \frac{Vr}{R2} \quad \text{[Formula 2]}$$

Note that approximation is performed on the assumption that Ra>>R1, R2, R3 is satisfied. At this time, a ratio of the current values before and after the first writing is expressed by Formula 3.

$$\frac{I1}{I0} = \frac{Vr}{R2} \times \frac{Ra}{3Vr} = \frac{Ra}{3R2} \quad \text{[Formula 3]}$$

Next, when second writing is performed, a short circuit is caused between the opposite electrode and the lower electrode at the opening 905. A reading current value I2 after the short circuit is expressed by Formula 4.

$$I2 = \frac{Vr}{R1} + \frac{Vr}{R2} + \frac{Vr}{(Ra+R3)} \approx \frac{Vr}{R1} + \frac{Vr}{R2} \quad \text{[Formula 4]}$$

At this time, a ratio of the current values before and after the second writing is expressed by Formula 5.

$$\frac{I2}{I1} = \left(\frac{Vr}{R1} + \frac{Vr}{R2}\right) \times \frac{R2}{Vr} = \frac{R1+R2}{R1} = 1 + \frac{R2}{R1} \quad \text{[Formula 5]}$$

Next, when third writing is performed, a short circuit is caused between the opposite electrode and the lower electrode at the opening 907. A reading current value I3 after the short circuit is expressed by Formula 6.

$$I3 = \frac{Vr}{R1} + \frac{Vr}{R2} + \frac{Vr}{R3} \quad \text{[Formula 6]}$$

At this time, a ratio of the current values before and after the third writing is expressed by Formula 7.

$$\frac{I3}{I2} = \left(\frac{Vr}{R1} + \frac{Vr}{R2} + \frac{Vr}{R3}\right) \div \left(\frac{Vr}{R1} + \frac{Vr}{R2}\right) == 1 + \frac{R1R2}{R3(R1+R2)} \quad \text{[Formula 7]}$$

According to Formula 5, a relation of R2>R1 needs to be satisfied in order to increase the ratio of the current values before and after writing. For example, the following method can be considered.

Figure 13A:
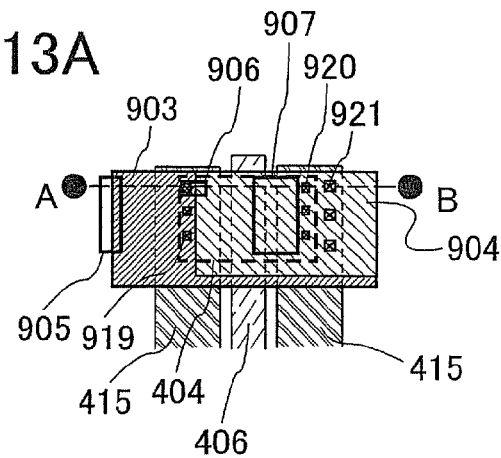
FIGS. 13A and 13C are top views of a semiconductor device of Embodiment Mode 2.
Figure 13B:
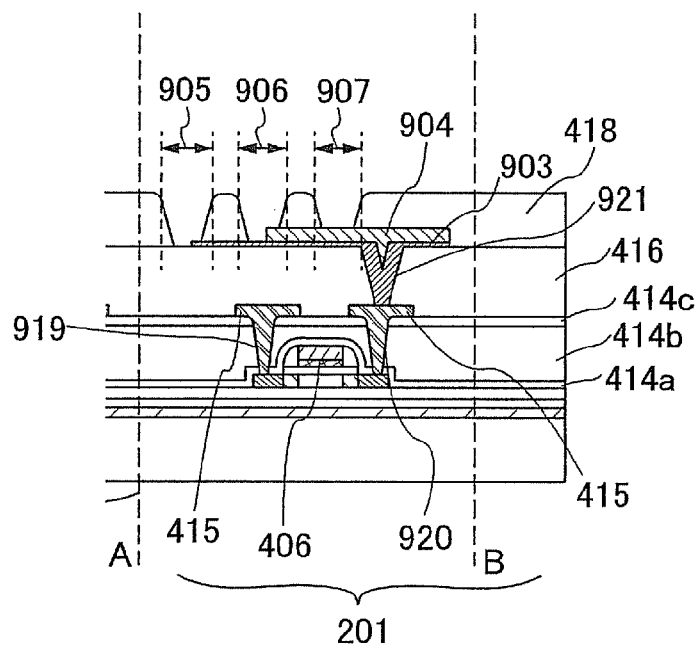
FIG. 13B is a cross sectional view of a semiconductor device of Embodiment Mode 2.

FIG. 13A shows a top view of a memory element and a thin film transistor which are in process of manufacture. FIG. 13B shows a cross sectional view along a dotted line AB in FIG. 13A. The thin film transistor includes the gate electrode layer 406, an island-shaped semiconductor layer 404, and the conductive layers 415 functioning as a source electrode or a drain electrode. The conductive layers 415 are electrically connected to the island-shaped semiconductor layer 404 through contact holes 919 and 920 which are formed in the first insulating layer 414a, the second insulating layer 414b, and the third insulating layer 414c. In addition, one of the conductive layers 415 is electrically connected to the conductive layer 903 through a contact hole 921 formed in the insulating layer 416.

The conductive layer 904 is formed over the conductive layer 903. As shown in FIG. 13A, the area of the conductive layer 903 is made larger than that of the conductive layer 904.

An end face of the conductive layer 903 (namely, a first step) is exposed in the opening 905 of the partition wall 418. An end face of the conductive layer 904 (namely, a second step) is exposed in the opening 906 of the partition wall 418. The second step is higher than the first step. A top surface of the conductive layer 904 is exposed in the opening 907 of the partition wall 418 and a step is not formed in the opening 907. Note that the opening 905, 906, 907 may also be referred to as regions surrounded by portions of the partition wall 418.

FIG. 13B shows a state through a step same as the cross sectional view shown in FIG. 6A. Subsequently, a material layer of the memory element is formed over the openings 905, 906, and 907, and the conductive layer is formed thereover; therefore, a memory element and a thin film transistor shown in FIG. 6B are manufactured. For example, by an ink-jet method, a material droplet to be the material layer of the memory element is dropped in the openings 905, 906, and 907 which are surrounded by the partition wall 418.

Since contact resistance is proportional to the area of the opening, by making the area of the opening 905 larger than that of the opening 906, a ratio of contact resistance can be increased and the ratio of the current value before and after the second writing can be increased.

Figure 13C:
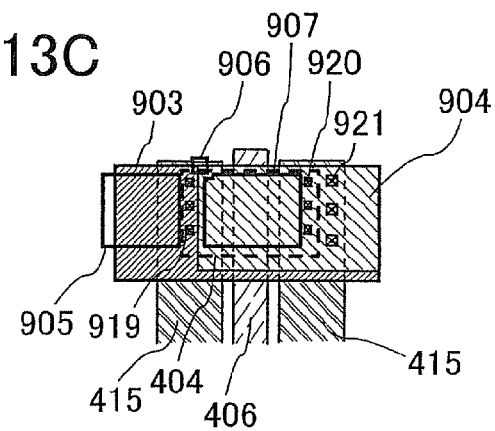

In addition, as shown in a top view of FIG. 13C, it is effective to devise a shape of the opening in order to further increase the area of the opening. FIG. 13C shows an example where positions and shapes of the openings 905, 906, and 907 of the partition wall 418 are devised. The opening 905 in FIG. 13C is larger than the opening 905 in FIG. 13A. The opening 907 in FIG. 13C is larger than the opening 907 in FIG. 13A. Further, the openings 905, 906, and 907 in FIG. 13A are arranged in a line, while the openings 905, 906, and 907 in FIG. 13C are not arranged in a line. As shown in FIG. 13C, the position of the openings is not limited, and the openings can be freely provided.

After that, the insulating layer 421 functioning as a protective film is formed. In order to improve impact resistance, the insulating layer 421 is preferably formed thick. Therefore, the insulating layer 421 is preferably formed using an organic material such as an epoxy resin or a polyimide resin. In addition, a drying agent is preferably dispersed in the insulating layer 421 in order to provide a hygroscopic property. This is because intrusion of moisture can be prevented particularly in the case where the material layer of the memory element is formed using an organic material. By sealing with the insulating layer 421 in this manner, intrusion of unnecessary oxygen as well as moisture can be prevented.

In this manner, the circuit including the thin film transistors which are provided in the control circuit portion 202 can be formed; and the memory element 426 which is formed over the same substrate as the circuit and provided in the memory element region 201, and the thin film transistor connected to the memory element 426 can be formed.

In the semiconductor device of the invention, the memory element 426 and the control circuit can be formed over the same substrate; therefore, manufacturing cost can be reduced. Further, since a conventional step of mounting a memory element formed by an IC is not required, a connection defect with the control circuit can be prevented.

Figure 7:
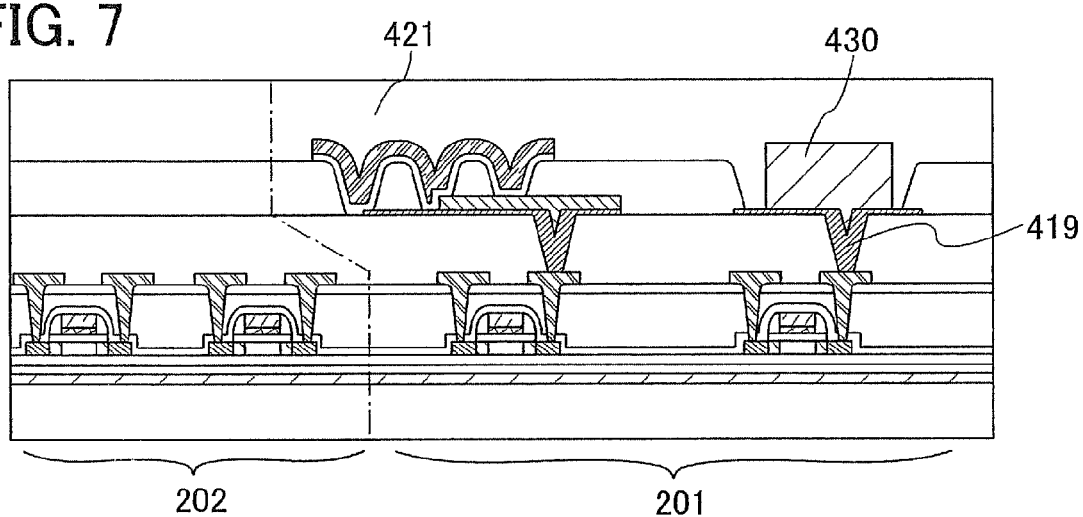
FIG. 7 is a view showing a manufacturing step of a semiconductor device of Embodiment Mode 2.

FIG. 7 shows a mode where the antenna 430 for supplying power or the like to the memory element 426 is provided. This embodiment mode shows a mode where the antenna 430 is formed in the opening provided in the partition wall.

The antenna 430 can be formed to be connected to the thin film transistor provided in the memory element region 201 and is formed of a conductive material, preferably a low-resistance material such as Cu (copper), Ag (silver), or Al (aluminum). Further, the antenna 430 is preferably formed to be thick in order to lower the resistance thereof. The antenna 430 can be formed by a vapor deposition method, a printing method, a plating method, or a droplet discharging method typified by an ink-jet method.

By forming the antenna 430 and the circuit over the same substrate in this manner, wireless communication with a reader/writer device can be performed. As a result, multivalued information can be obtained from the memory element 426 without breakdown.

Figure 8A:
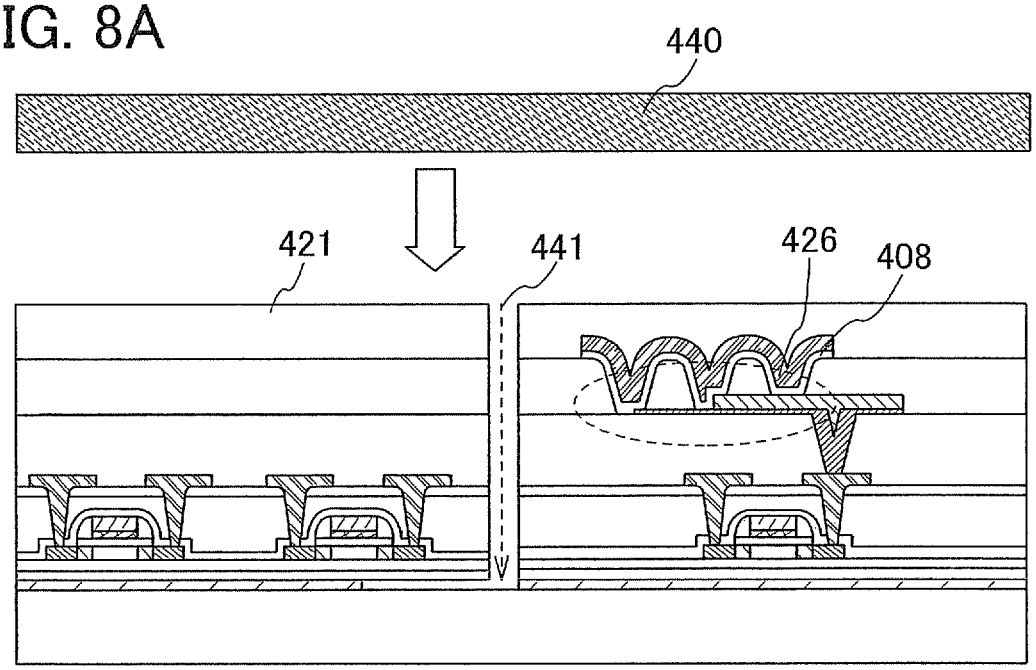
FIGS. 8A and 8B are views showing a manufacturing step of a semiconductor device of Embodiment Mode 2.

Although a memory device can be completed through the aforementioned steps, a groove may be formed thereafter as shown in FIG. 8A, and the etchant 441 may be introduced into the groove so that the glass substrate 401 is peeled off. At this time, the resin substrate 440 attached onto the insulating layer 421 is preferably used as a supporting base in order to easily peel off the glass substrate 401. Note that the resin substrate 440 may be attached by using an adhesion function of the insulating layer 421. The resin substrate 440 may be formed using plastic typified by polyethylene terephthalate (PET), polyethylene naphthalate (PEN), or polyethersulfone (PES); or a synthetic resin such as acrylic. Since such a resin substrate is quite thin, it has flexibility. Therefore, the glass substrate 401 can be sequentially peeled off by attaching the rolled up resin substrate 440 onto the insulating layer 421. Such a step is suitable for mass production.

The etchant 441 is not specifically limited to a certain type as long as the separation layer 402 can be selectively etched. For example, a halogen compound may be used. When amorphous silicon or tungsten is used for the separation layer, ClF$_3$ (chlorine trifluoride) can be used as the etchant. In addition, when silicon oxide is used for the separation layer, HF (hydrogen fluoride) can be used as the etchant.

Figure 8B:
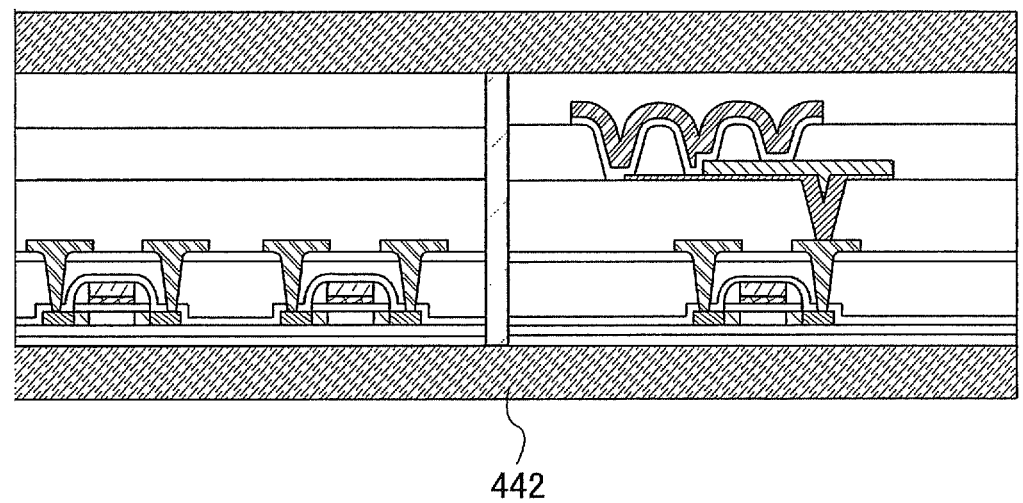

Then, as shown in FIG. 8B, the resin substrate 442 is attached instead of the peeled glass substrate 401. Note that the resin substrate 442 may be formed using a material similar to that of the resin substrate 440.

As a result of peeling off the glass substrate 401 in this manner, reduction in thickness and weight of a semiconductor device including the memory element and the antenna can be achieved and flexibility and impact resistance thereof can be improved.

Further, the substrate is divided into a plurality of semiconductor devices each including a memory element. As a result, cost reduction of the semiconductor device including the memory element can be achieved.

Further, a protective layer such as a gas barrier layer may be provided on each surface of the resin substrates 440 and 442. The provision of the protective layer can prevent intrusion of oxygen and alkaline elements, and thereby reliability can be improved. The protective layer is formed using an inorganic material containing nitrogen, such as an aluminum nitride film or a silicon nitride film.

Although this embodiment mode shows a mode where the glass substrate 401 is removed and the resin substrates 440 and 442 are attached, the invention is not limited to this. Note that reduction in weight and thickness of the semiconductor device including the memory element can be achieved by removing the glass substrate 401.

Although a thin film transistor in this embodiment mode has a stacked-layer structure where a semiconductor layer, a gate insulating layer and a gate electrode layer are sequentially stacked over a substrate, the thin film transistor used in the invention is not limited to have this structure, and such a structure may be adopted, in which a gate electrode layer, an insulating layer, and a semiconductor layer are stacked in this order. Further, although the thin film transistor has impurity regions such as the first impurity region (also referred to as a low concentration impurity region) 410 and the second impurity region (also referred to as a high concentration impurity region) 411, the invention is not limited to these, and a single-drain structure having a uniform concentration of impurities may be adopted as well.

In addition, a multilayer structure may be adopted where a plurality of thin film transistors shown in this embodiment mode are stacked. When such a multilayer structure is employed, a low dielectric constant (low-k) material is preferably used as a material of an insulating layer in order to reduce parasitic capacitance which is generated in the insulating layer between the stacked thin film transistors. For example, in addition to the aforementioned materials, a resin material such as an epoxy resin or an acrylic resin, or an organic material such as siloxane may be used. By employing the multilayer structure which reduces parasitic capacitance, reduction of area, high-speed operation and low power consumption of the memory device can be achieved.

In this manner, in the invention, a memory cell can be multivalued in one memory cell. Thus, storage capacity of a memory region in the semiconductor device can be increased.

Note that this embodiment mode can be freely implemented in combination with Embodiment Mode 1.

Embodiment Mode 3

In this embodiment mode, description is made of a method in which a margin of a reading current is increased by using difference of contact resistance with that of the opposite electrode for each region when a plurality of regions having a different breakdown voltage (writing voltage value) are formed in a memory cell. In addition, parts of the steps same as those of Embodiment Mode 1 are described using the same drawings and the same reference numerals.

When a plurality of regions having a different breakdown voltage are formed in the memory cell, a lower electrode is formed of a different material for each region so that a conductive layer with high contact resistance with an upper electrode is used for a region with a low breakdown voltage and a conductive layer with low contact resistance is used for a region with a high breakdown voltage. Accordingly, a ratio of reading current between bits can be increased, which is effective. The method is described below.

First, in the same manner as in FIG. 1A, the separation layer 402 is formed over the glass substrate 401. Quartz, silicon, metal, or the like is used for the insulating substrate as well as glass. The separation layer 402 is obtained by forming a film containing metal or a film containing silicon entirely or selectively over the substrate.

Next, in the same manner as in Embodiment Mode 1, the insulating layer 403 is formed so as to cover the separation layer 402. The insulating layer 403 is formed of silicon oxide, silicon nitride, or the like. Then, the semiconductor layer is formed over the insulating layer 403 and crystallized by laser crystallization, thermal crystallization using a metal catalyst, or the like, and then patterned into a desired shape to form the island-shaped semiconductor layer. The laser crystallization may be performed by using a continuous wave laser or a pulsed laser.

Next, in the same manner as in Embodiment Mode 1, the gate insulating layer 405 is formed so as to cover the semiconductor layer. The gate insulating layer 405 is formed using silicon oxide, silicon nitride, or the like. The gate insulating layer 405 can be formed by a CVD method, a thermal oxidation method, or the like. Alternatively, the semiconductor layer and the gate insulating layer 405 may be continuously formed by a CVD method, and subsequently can be patterned at the same time. In this case, impurity contamination at the boundary between each layer can be suppressed.

Then, in the same manner as in Embodiment Mode 1, the gate electrode layer 406 is formed. The gate electrode layer 406 is formed by using an element selected from tantalum (Ta), tungsten (W), titanium (Ti), molybdenum (Mo), aluminum (Al), and copper (Cu), or an alloy material or a compound material including such elements as a main component, and patterned into a desired shape. In the case of patterning by a photolithography method, the width of the gate electrode can be made narrower by using a resist mask of which width is narrowed by plasma etching or the like. Accordingly, performance of a transistor can be improved. The gate electrode layer 406 may have either a single-layer structure or a stacked-layer structure.

Next, in the same manner as in Embodiment Mode 1, impurity elements which imparts a conductivity type are added to the semiconductor layer to form the impurity region 407. The impurity region 407 is formed by using a resist mask formed by a photolithography method and adding an impurity element such as phosphorus, arsenic, or boron. With the impurity element, a polarity of either an n-channel type or a p-channel type can be determined.

Then, in the same manner as in Embodiment Mode 1, as shown in FIG. 1B, the insulating layer is formed of an insulator containing silicon, for example, silicon nitride, and the insulating layer is anisotropically (perpendicularly) etched to form the insulating layer (also referred to as the sidewall) 409 which contacts with a side surface of the gate electrode. When the sidewall is formed, the gate insulating layer 405 might be etched.

Next, in the same manner as in Embodiment Mode 1, impurities are further added to the semiconductor layer to form the first impurity region 410 right under the insulating layer (sidewall) 409 and the second impurity region 411 having a higher concentration of impurities than the first impurity region 410.

Then, in the same manner as in Embodiment Mode 1, the insulating layer is formed so as to cover the semiconductor layer and the gate electrode layer 406. The insulating layer is formed by using an inorganic material, an organic material, or the like which has an insulating property. As an inorganic material having an insulating property, silicon oxide, silicon nitride, or the like can be used. As an organic material having an insulating property, polyimide, acrylic, polyamide, polyimide amide, resist, benzocyclobutene, siloxane, or polysilazane can be used.

Here, similarly to FIG. 1C, a mode where the insulating layer is formed to have a stacked-layer structure is shown, and the first insulating layer 414a, the second insulating layer 414b, and the third insulating layer 414c are formed in this order from the bottom. The first insulating layer 414a is preferably formed by a plasma CVD method so as to contain much hydrogen since dangling bonds of the semiconductor layer can be reduced by hydrogen. The second insulating layer 414b is preferably formed using an organic material since planarity can be improved. The third insulating layer 414c is preferably formed using an inorganic material in order to prevent discharge of moisture or the like from the second insulating layer 414b formed of an organic material or to prevent intrusion of moisture through the second insulating layer 414b.

Next, the contact hole is formed in the insulating layer to expose the second impurity region 411, and similarly to FIG. 1D, the conductive layer 415 is formed so as to fill the contact hole. The conductive layer 415 includes a film formed of an element selected from aluminum (Al), titanium (Ti), molybdenum (Mo), and tungsten (W), an alloy film including such elements, an alloy film including such elements and silicon, or the like. Further, the conductive layer 415 can be formed to have a single-layer structure or a stacked-layer structure. After that, the conductive layer 415 is patterned into a desired shape, and a source electrode, a drain electrode, and other electrodes are formed at the same time.

In order to lower contact resistance between the source electrode and the drain electrode; and the second impurity region 411, a silicide may be formed on the impurity region. For example, a film including a metal element (typically, Ni) is formed on the second impurity region 411 and heated by a thermal annealing method using an annealing furnace, a laser annealing method, or a rapid thermal annealing method (RTA method). As a result, a silicide including the metal element and silicon is formed on the second impurity region; therefore, improvement in on current or mobility can be realized.

In this manner, the thin film transistors are completed in the control circuit portion 202 and the memory element region 201. In the control circuit portion 202, the circuit is formed by using the thin film transistors.

Next, the insulating layer 416 is formed so as to cover the conductive layer 415. The insulating layer 416 may be formed using an inorganic material, an organic material, or the like which has an insulating property, and may have a single-layer structure or a stacked-layer structure. An inorganic material or an organic material similar to those of the first insulating layer 414a, the second insulating layer 414b, and the third insulating layer 414c can be used for the insulating layer 416.

Figure 9A:
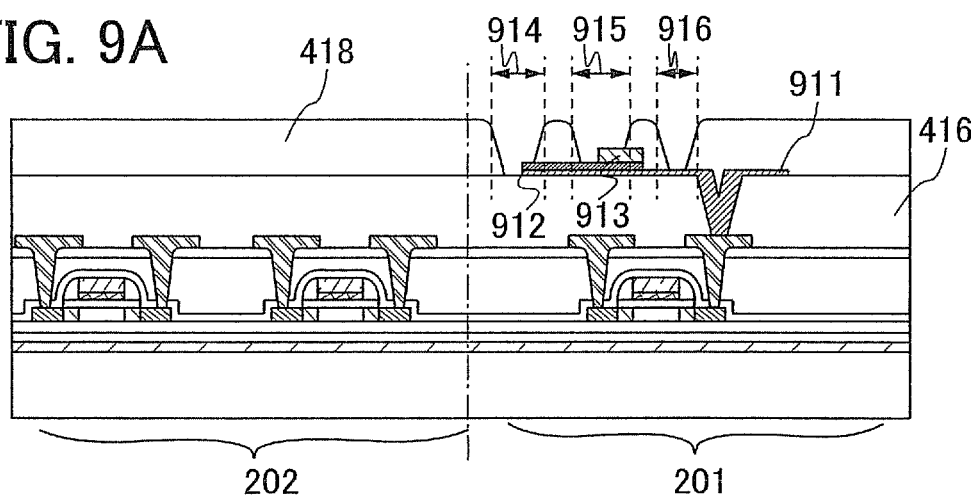
FIGS. 9A and 9B are views showing a manufacturing step of a semiconductor device of Embodiment Mode 3.

As shown in FIG. 9A, the insulating layer 416 is selectively etched to form a contact hole so that the conductive layer 415 is exposed, and conductive layers 911, 912, and 913 are stacked so as to fill the contact hole. Each of the conductive layers 911, 912, and 913 includes a film formed of an element selected from aluminum (Al), titanium (Ti), molybdenum (Mo), and tungsten (W), an alloy film including such elements, an alloy film including such elements and silicon, or the like. Alternatively, the conductive layers 911, 912, and 913 may be formed by using a light transmitting material such as indium tin oxide (ITO), indium tin oxide containing silicon oxide, or indium oxide containing 2 to 20% of zinc oxide.

When contact resistance of the conductive layer 912 and the opposite electrode 420 after a short circuit is denoted by R1, contact resistance of the conductive layer 913 and the opposite electrode 420 after a short circuit is denoted by R2, and contact resistance of the conductive layer 911 and the opposite electrode 420 after a short circuit is denoted by R3, it is important to select the conductive layers 911 to 913 which can satisfy R2>R1>R3. The reason is described below. In FIG. 9A, indium tin oxide (ITO) is used for the conductive layer 911, tungsten (W) is used for the conductive layer 912, and titanium (Ti) is used for the conductive layer 913.

The conductive layers 911, 912, and 913 are processed into a desired shape. The conductive layers 911, 912, and 913 can function as the lower electrodes of the memory element and also as the steps for adjusting the breakdown voltage of the memory element.

Next, an insulating layer is formed so as to cover the conductive layers 911, 912, and 913, and a plurality of openings are provided. The partition wall 418 provided with openings 914, 915, and 916 is formed.

Note that although this embodiment mode shows the case where the lower electrode of the memory element is formed of the conductive layers 911 to 913, the conductive layer 415 to be a source electrode or a drain electrode of a thin film transistor may be used in common for the lower electrode of the memory element.

Figure 9B:
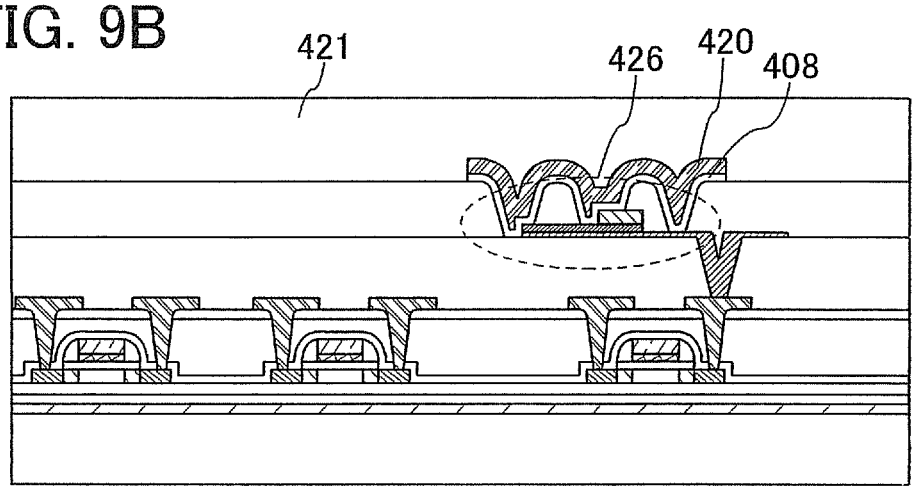

Next, as shown in FIG. 9B, the material layer 408 of the memory element is formed in the opening of the partition wall. The material layer 408 of the memory element can be formed by a vapor deposition method, a spin coating method, or a droplet discharging method typified by an ink-jet method.

Since the material layer 408 of the memory element can also be formed using the same material as the electroluminescent layer included in the light emitting element, the memory element and the light emitting element can be formed over the same substrate. That is, a memory device having a display function can be formed.

Next, the conductive layer to be the opposite electrode 420 is formed. Since the opposite electrode 420 can be formed over the whole surface of the memory element region, patterning by a photolithography method is not required. Needless to say, the opposite electrode 420 may be selectively formed by patterning. The opposite electrode 420 can function as the upper electrode of the memory element.

Thus, the memory element 426 including the conductive layer 417, the material layer 408 of the memory element, and the opposite electrode 420 is formed. In one memory cell, three memory elements corresponding to the three openings 914, 915, and 916 are formed, and this memory cell has three voltage values by which electric resistance is changed.

Writing includes first writing, second writing, and third writing in order of increasing writing voltage. When the first writing is performed, a short circuit between the upper electrode and the lower electrode is caused in a memory provided in the opening 915 which has the highest electrode step. In the case where a semiconductor or an insulator is used as a memory layer, a current flowing to the memory provided in the opening 915 is extremely larger than a current flowing to memories provided in the openings 914 and 916, in which a short circuit is not caused; therefore, the current flowing to the memory provided in the opening 915 is dominant for a current value which flows to the whole memory cell. Next, when the second writing is performed, a short circuit is caused between the opposite electrode and the lower electrode at the opening 914. Therefore, the sum of the current flowing to the memory provided in the opening 915 and the current flowing to the memory provided in the opening 914 is dominant for a current which supplies to the whole memory cell. Similarly, a current which flows to the whole memory cell after the third writing is the sum of the current flowing to each of the memories provided in the opening 914, 915, and 916, respectively. Since the contact resistance R1 to R3 of the conductive layers 911 to 913 and the opposite electrode 420 is related to R2>R1>R3, a ratio of the current value flowing after the first writing and the current value flowing after the second writing can be increased and a margin for reading can be increased.

Further, description is made in detail by using the formulae. A resistance value of the memory layer before a short circuit is denoted by Ra. A voltage applied to the memory element in reading is denoted by Vr. A reading current value before reading is expressed by Formula 1 shown in Embodiment Mode 2. Note that approximation is performed on the assumption that Ra>>R2>R1>R3 is satisfied. When the first writing is performed, a short circuit is caused between the opposite electrode and the lower electrode at the opening 915. A reading current value I1 after the short circuit is expressed by Formula 2 shown in Embodiment Mode 2. Note that approximation is performed on the assumption that Ra>>R2>R1>R3 is satisfied. At this time, a ratio of the current values before and after the first writing is expressed by Formula 3 shown in Embodiment Mode 2.

It can be said that the ratio of the reading current is sufficiently large since Ra>>R1 is satisfied. Next, when the second writing is performed, a short circuit is caused between the opposite electrode and the lower electrode at the opening 914. A reading current value I2 after the short circuit is expressed by Formula 4 shown in Embodiment Mode 2. Note that approximation is performed on the assumption that Ra>>R2>R1>R3 is satisfied. At this time, a ratio of the current values before and after the second writing is expressed by Formula 5 shown in Embodiment Mode 2. The ratio of the reading current can be increased by making R2 sufficiently larger than R1. Next, when the third writing is performed, a short circuit is caused between the opposite electrode and the lower electrode at the opening 916. A reading current value I3 after the short circuit is expressed by Formula 6 shown in Embodiment Mode 2. Note that approximation is performed on the assumption that Ra>>R1>R2>R3 is satisfied. At this time, a ratio of the current values before and after the third writing is expressed by Formula 7 shown in Embodiment Mode 2. At this time, the ratio of the reading current can be increased by making R3 sufficiently larger than R1 and R2.

Note that in this embodiment mode, although a margin for reading is increased by using difference of contact resistance, it can also be increased by using a material which satisfies R4>R5>R6 when resistant values of electrode materials of the conductive layers 911, 912, and 913 to be the lower electrodes are denoted by R4, R5, and R6, respectively; therefore, a margin for reading can be increased.

As described above, in the invention, a memory cell can be multivalued in one memory cell. Thus, storage capacity of the memory device can be increased.

FIG. 10 shows a mode where the antenna 430 for supplying power or the like to the memory element 426 is provided. This embodiment mode shows a mode where the antenna 430 is formed at the opening provided in the partition wall.

The antenna 430 can be formed to be electrically connected to the thin film transistor provided in the memory element region 201 and is formed of a conductive material, preferably a low-resistance material such as Cu (copper), Ag (silver), or Al (aluminum). Further, the antenna 430 is preferably formed to be thick in order to lower the resistance thereof. The antenna 430 can be formed by a vapor deposition method, a printing method, a plating method, or a droplet discharging method typified by an ink-jet method.

By forming the antenna 430 and the thin film transistor over the same substrate in this manner, wireless communication with a reader/writer device can be performed. As a result, multivalued information can be obtained from the memory element 426 without breakdown.

Note that this embodiment mode can be freely implemented in combination with Embodiment Mode 1 or 2.

Embodiment Mode 4

In this embodiment mode, a method of forming a memory element over a glass substrate as an insulating substrate is described. A method of forming the memory element over a plurality of electrode steps is described. Note that a mode in which the memory element and a circuit (a control circuit) for controlling the memory element are formed over the same substrate is shown. In addition, parts of the steps same as Embodiment Mode 1 are described using the same drawings and the same reference numerals.

First, in the same manner as in FIG. 1A, the separation layer 402 is formed over the glass substrate 401. Quartz or the like is used for the insulating substrate as well as glass. The separation layer 402 is obtained by forming a film containing metal or a film containing silicon entirely or selectively over the substrate.

Next, in the same manner as in Embodiment Mode 1, the insulating layer 403 is formed so as to cover the separation layer 402. The insulating layer 403 is formed of silicon oxide, silicon nitride, or the like. Then, the semiconductor layer is formed over the insulating layer 403 and crystallized by laser crystallization, thermal crystallization using a metal catalyst, or the like, and then patterned into a desired shape to form the island-shaped semiconductor layer. The laser crystallization may be performed by using a continuous wave laser or a pulsed laser.

Next, in the same manner as in Embodiment Mode 1, the gate insulating layer 405 is formed so as to cover the semiconductor layer. The gate insulating layer 405 is formed using silicon oxide, silicon nitride, or the like. The gate insulating layer 405 can be formed by a CVD method, a thermal oxidation method, or the like. Alternatively, the semiconductor layer and the gate insulating layer 405 may be continuously formed by a CVD method, and subsequently can be patterned at the same time. In this case, impurity contamination at the boundary between each layer can be suppressed.

Then, in the same manner as in Embodiment Mode 1, the gate electrode layer 406 is formed. The gate electrode layer 406 is formed by using an element selected from tantalum (Ta), tungsten (W), titanium (Ti), molybdenum (Mo), aluminum (Al), and copper (Cu), or an alloy material or a compound material including such elements as a main component, and patterned into a desired shape. In the case of patterning by a photolithography method, the width of the gate electrode can be made narrower by using a resist mask of which width is narrowed by plasma etching or the like. Accordingly, performance of a transistor can be improved. The gate electrode layer 406 may have either a single-layer structure or a stacked-layer structure.

Next, in the same manner as in Embodiment Mode 1, impurity elements are added to the semiconductor layer to form the impurity region 407. The impurity region 407 is formed by using a resist mask formed by a photolithography method and adding an impurity element such as phosphorus, arsenic, or boron. With the impurity element, a polarity of either an n-channel type or a p-channel type can be determined.

Then, in the same manner as in Embodiment Mode 1, as shown in FIG. 1B, the insulating layer is formed of an insulator containing silicon, for example, silicon nitride, and the insulating layer is anisotropically (perpendicularly) etched to form the insulating layer (also referred to as the sidewall) 409 which contacts with a side surface of the gate electrode. When the sidewall is formed, the gate insulating layer 405 might be etched.

Next, in the same manner as in Embodiment Mode 1, impurities are further added to the semiconductor layer to form the first impurity region 410 right under the insulating layer (sidewall) 409 and the second impurity region 411 having a higher concentration of impurities than the first impurity region 410.

Then, in the same manner as in Embodiment Mode 1, the insulating layer is formed so as to cover the semiconductor layer and the gate electrode layer 406. The insulating layer is formed using an inorganic material, an organic material, or the like, which has an insulating property. As an inorganic material having an insulating property, silicon oxide, silicon nitride, or the like can be used. As an organic material having an insulating property, polyimide, acrylic, polyamide, polyimide amide, resist, benzocyclobutene, siloxane, or polysilazane can be used.

Here, as shown in FIG. 1C, a mode is shown where the insulating layer is formed to have a stacked-layer structure, and the first insulating layer 414a, the second insulating layer 414b, and the third insulating layer 414c are formed in this order from the bottom. The first insulating layer 414a is preferably formed by a plasma CVD method so as to contain much hydrogen since dangling bonds of the semiconductor layer can be reduced by hydrogen. The second insulating layer 414b is preferably formed using an organic material since planarity can be improved. The third insulating layer 414c is preferably formed using an inorganic material in order to prevent discharge of moisture or the like from the second insulating layer 414b formed of an organic material or to prevent intrusion of moisture through the second insulating layer 414b.

Next, the contact hole is formed in the insulating layer to expose the second impurity region 411, and similarly to FIG. 1D, the conductive layer 415 is formed so as to fill the contact hole. The conductive layer 415 includes a film formed of an element selected from aluminum (Al), titanium (Ti), molybdenum (Mo), and tungsten (W), an alloy film including such elements, an alloy film including such elements and silicon, or the like. Further, the conductive layer 415 can be formed to have a single-layer structure or a stacked-layer structure. After that, the conductive layer 415 is patterned into a desired shape, and a source electrode, a drain electrode, and other electrodes are formed at the same time.

In order to lower contact resistance between the source electrode and the drain electrode; and the second impurity region 411, a silicide may be formed on the impurity region. For example, a film including a metal element (typically, Ni) is formed on the second impurity region 411 and heated by a thermal annealing method using an annealing furnace, a laser annealing method, or a rapid thermal annealing method (RTA method). As a result, a silicide including the metal element and silicon is formed on the second impurity region; therefore, improvement in on current or mobility can be realized.

In this manner, the thin film transistors are completed in the control circuit portion 202 and the memory element region 201. In the control circuit portion 202, a circuit is formed by using the thin film transistors.

Next, in the same manner as in Embodiment Mode 1, the insulating layer 416 is formed so as to cover the conductive layer 415. The insulating layer 416 may be formed using an inorganic material, an organic material, or the like which has an insulating property, and may have a single-layer structure or a stacked-layer structure. An inorganic material or an organic material similar to those of the first insulating layer 414a, the second insulating layer 414b, and the third insulating layer 414c can be used.

Figure 11A:
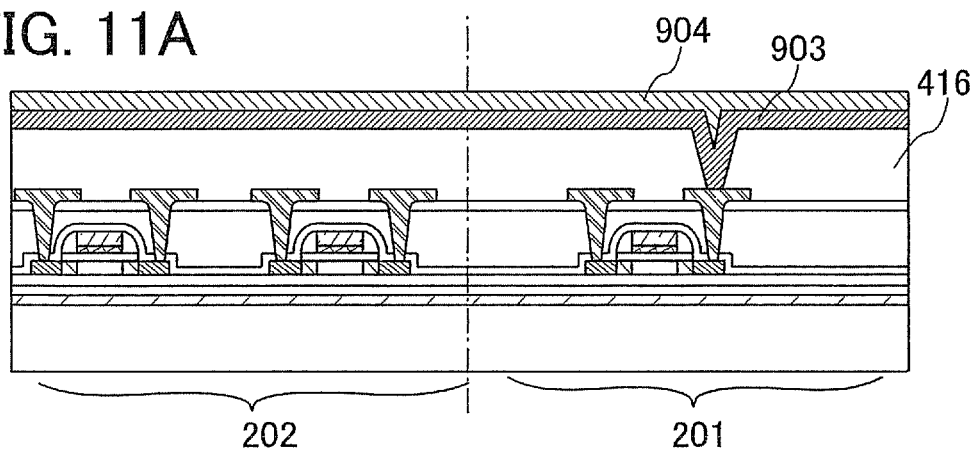
FIGS. 11A and 11B are views showing a manufacturing step of a semiconductor device of Embodiment Mode 4.

After that, as shown in FIG. 11A, the insulating layer 416 is formed in a contact hole so as to expose the conductive layer 415, and the conductive layers 903 and 904 are stacked so as to fill the contact hole. Each of the conductive layers 903 and 904 includes a film formed of an element selected from aluminum (Al), titanium (Ti), molybdenum (Mo), and tungsten (W), an alloy film including such elements, an alloy film including such elements and silicon, or the like. Alternatively, the conductive layers 903 and 904 may be formed by using a light transmitting material such as indium tin oxide (ITO), indium tin oxide containing silicon oxide, or indium oxide containing 2 to 20% of zinc oxide. In FIG. 11A, titanium is used for the conductive layer 903 and aluminum is used for the conductive layer 904.

Figure 11B:
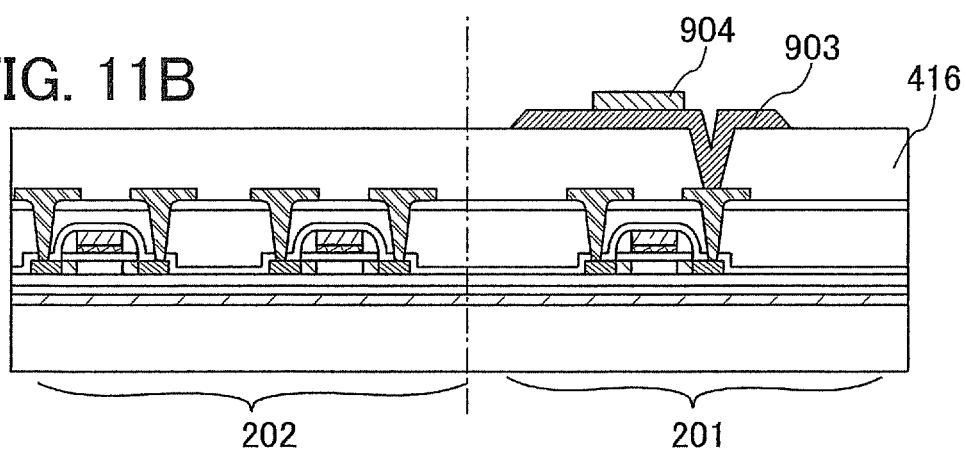

Next, as shown in FIG. 11B, a taper angle of the conductive layer 903 is made smaller than a taper angle of the conductive layer 904. Here, a side surface of the conductive layer 904 is inclined at approximately 90° with respect to a substrate surface. Although the angle is not tapered, it is referred to as a taper angle. Further, the taper angle of the conductive layer 904 is approximately 45°. The conductive layers 903 and 904 are processed so as to expose a surface of the conductive layer 904, so that two steps having different taper angles can be provided. It is considered that the lower a breakdown voltage of the memory element is, the larger a taper angle is; therefore, by providing two steps having different taper angles using the lower electrode, two memories having a different breakdown voltage of the memory element can be formed. That is, the conductive layers 903 and 904 can function as the lower electrodes of the memory element and also as the steps for adjusting the breakdown voltage of the memory element.

Figure 12A:
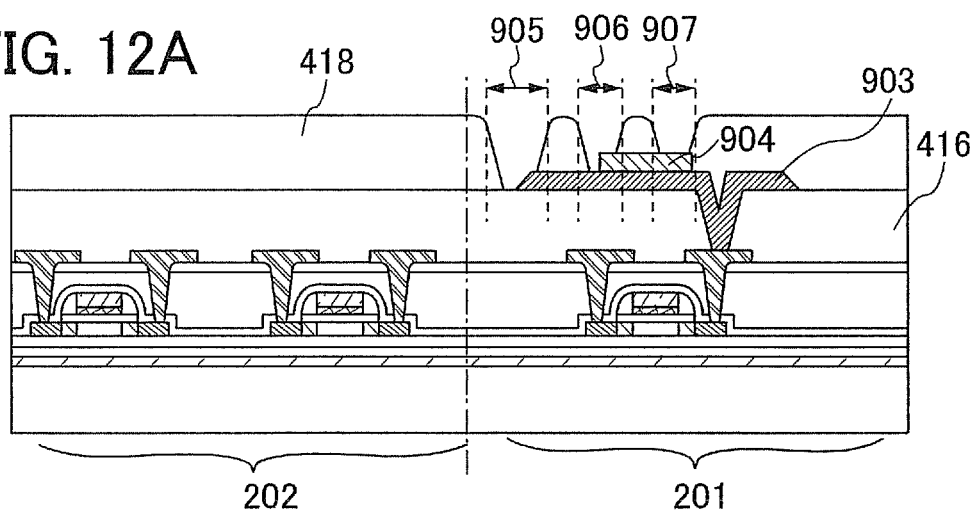
FIGS. 12A and 12B are views showing a manufacturing step of a semiconductor device of Embodiment Mode 4.

Next, as shown in FIG. 12A, an insulating layer is formed so as to cover the conductive layers 903 and 904, and a plurality of openings are provided. The openings 905, 906, and 907 of the partition wall 418 are formed by etching.

As described above, a plurality of openings and the conductive layer having a plurality of steps can be formed.

Note that although this embodiment mode shows the case where the lower electrode of the memory element is formed of the conductive layers 903 and 904, the conductive layer 415 to be a source electrode or a drain electrode of a thin film transistor may be used in common for the lower electrode of the memory element.

Figure 12B:
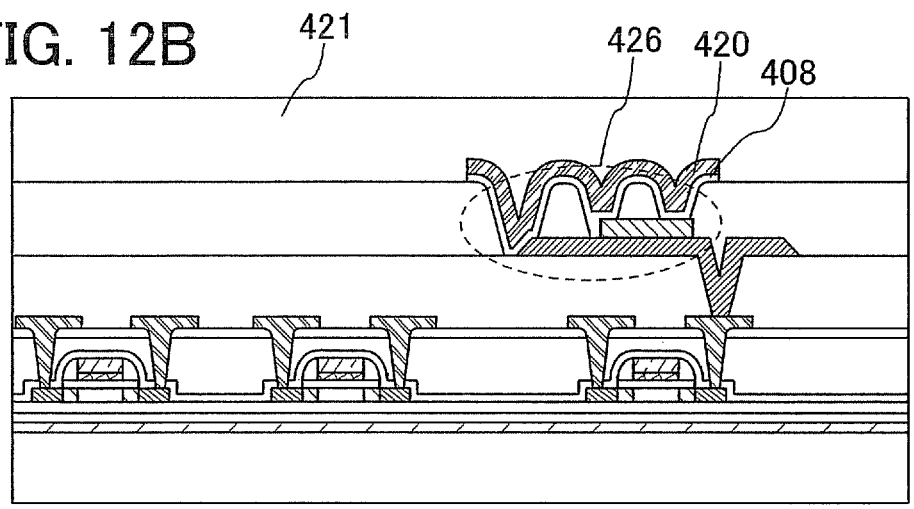

Next, as shown in FIG. 12B, the material layer 408 of the memory element is formed in the opening of the partition wall. The material layer 408 of the memory element can be formed by a vapor deposition method, a spin coating method, or a droplet discharging method typified by an ink-jet method.

Since the material layer 408 of the memory element can also be formed using the same material as the electroluminescent layer included in the light emitting element, the memory element and the light emitting element can be formed over the same substrate. That is, a memory device having a display function can be formed.

Next, the conductive layer to be the opposite electrode 420 is formed. Since the opposite electrode 420 can be formed over the whole surface of the memory element region, patterning by a photolithography method is not required. Needless to say, the opposite electrode 420 may be selectively formed by patterning. The opposite electrode 420 can function as the upper electrode of the memory element.

Thus, the memory element 426 including the conductive layer 417, the material layer 408 of the memory element, and the opposite electrode 420 is formed. In one memory cell, three memory elements corresponding to the three openings 905, 906, and 907 are formed, and this memory cell has three voltage values by which electric resistance is changed.

In this manner, in the invention, a memory cell can be multivalued in one memory cell. Thus, storage capacity of a memory device can be increased.

In addition, according to Embodiment Mode 1, an antenna for supplying power or the like to the memory element 426 can be provided. The antenna can be formed to be connected to the thin film transistor provided in the memory element region 201 and is formed of a conductive material, preferably a low-resistance material such as Cu (copper), Ag (silver), or Al (aluminum).

Although a semiconductor device including the memory element region and the antenna can be completed through the aforementioned steps, the glass substrate 401 may be peeled off later in the steps shown in Embodiment Mode 1.

Then, a flexible resin substrate is attached instead of the peeled glass substrate 401.

As a result of peeling off the glass substrate 401 in this manner, reduction in thickness and weight of a semiconductor device including the memory element can be achieved and flexibility and impact resistance thereof can be improved.

Note that this embodiment mode can be freely implemented in combination with Embodiment Mode 1, 2, or 3.

Embodiment Mode 5

In this embodiment mode, a method of forming a memory element over a glass substrate as an insulating substrate is described. The memory element is formed over a plurality of electrode steps. Note that a mode in which the memory element and a circuit (a control circuit) for controlling the memory element are formed over the same substrate is shown. In addition, parts of the steps same as those in Embodiment Mode 1 are described using the same drawings and the same reference numerals.

First, in the same manner as in FIG. 1A, the separation layer 402 is formed over the glass substrate 401. Quartz or the like is used for the insulating substrate as well as glass. The separation layer 402 is obtained by forming a film containing metal or a film containing silicon entirely or selectively over the substrate.

Next, in the same manner as in Embodiment Mode 1, the insulating layer 403 is formed so as to cover the separation layer 402. The insulating layer 403 is formed of silicon oxide, silicon nitride, or the like. Then, the semiconductor layer is formed over the insulating layer 403 and crystallized by laser crystallization, thermal crystallization using a metal catalyst, or the like, and then patterned into a desired shape to form the island-shaped semiconductor layer. The laser crystallization may be performed by using a continuous wave laser or a pulsed laser.

Next, in the same manner as in Embodiment Mode 1, the gate insulating layer 405 is formed so as to cover the semiconductor layer. The gate insulating layer 405 is formed using silicon oxide, silicon nitride, or the like. The gate insulating layer 405 can be formed by a CVD method, a thermal oxidation method, or the like. Alternatively, the semiconductor layer and the gate insulating layer 405 may be continuously formed by a CVD method, and subsequently can be patterned at the same time. In this case, impurity contamination at the boundary between each layer can be suppressed.

Then, in the same manner as in Embodiment Mode 1, the gate electrode layer 406 is formed. The gate electrode layer 406 is formed by using an element selected from tantalum (Ta), tungsten (W), titanium (Ti), molybdenum (Mo), aluminum (Al), and copper (Cu), or an alloy material or a compound material including such elements as a main component, and patterned into a desired shape. In the case of patterning by a photolithography method, the width of the gate electrode can be made narrower by using a resist mask of which width is narrowed by plasma etching or the like. Accordingly, performance of a transistor can be improved. The gate electrode layer 406 may have either a single-layer structure or a stacked-layer structure.

Next, in the same manner as in Embodiment Mode 1, impurity elements are added to the semiconductor layer to form the impurity region 407. The impurity region 407 is formed by using a resist mask formed by a photolithography method and adding an impurity element such as phosphorus, arsenic, or boron. With the impurity element, a polarity of either an n-channel type or a p-channel type can be determined.

Then, in the same manner as in Embodiment Mode 1, as shown in FIG. 1B, the insulating layer is formed of an insulator containing silicon, for example, silicon nitride, and the insulating layer is anisotropically (perpendicularly) etched to form the insulating layer (also referred to as the sidewall) 409 which contacts with a side surface of the gate electrode. When the sidewall is formed, the gate insulating layer 405 might be etched.

Next, in the same manner as in Embodiment Mode 1, impurities are further added to the semiconductor layer to form the first impurity region 410 right under the insulating layer (sidewall) 409 and the second impurity region 411 having a higher concentration of impurities than the first impurity region 410.

Then, in the same manner as in Embodiment Mode 1, the insulating layer is formed so as to cover the semiconductor layer and the gate electrode layer 406. The insulating layer is formed using an inorganic material, an organic material, or the like which has an insulating property. As an inorganic material having an insulating property, silicon oxide, silicon nitride, or the like can be used. As an organic material having an insulating property, polyimide, acrylic, polyamide, polyimide amide, resist, benzocyclobutene, siloxane, or polysilazane can be used.

Here, as shown in FIG. 1C, a mode is shown where the insulating layer is formed to have a stacked-layer structure, and the first insulating layer 414a, the second insulating layer 414b, and the third insulating layer 414c are formed in this order from the bottom. The first insulating layer 414a is preferably formed by a plasma CVD method so as to contain much hydrogen since dangling bonds of the semiconductor layer can be reduced by hydrogen. The second insulating layer 414b is preferably formed using an organic material since planarity can be improved. The third insulating layer 414c is preferably formed using an inorganic material in order to prevent discharge of moisture or the like from the second insulating layer 414b formed of an organic material or to prevent intrusion of moisture through the second insulating layer 414b.

Next, the contact hole is formed in the insulating layer to expose the second impurity region 411, and as shown in FIG. 1D, the conductive layer 415 is formed so as to fill the contact hole. The conductive layer 415 includes a film formed of an element selected from aluminum (Al), titanium (Ti), molybdenum (Mo), and tungsten (W), an alloy film including such elements, an alloy film including such elements and silicon, or the like. Further, the conductive layer 415 can be formed to have a single-layer structure or a stacked-layer structure. After that, the conductive layer 415 is patterned into a desired shape, and a source electrode, a drain electrode, and other electrodes are formed at the same time.

In order to lower contact resistance between the source electrode and the drain electrode; and the second impurity region 411, a silicide may be formed on the impurity region. For example, a film including a metal element (typically, Ni) is formed on the second impurity region 411 and heated by a thermal annealing method using an annealing furnace, a laser annealing method, or a rapid thermal annealing method (RTA method). As a result, a silicide including the metal element and silicon is formed on the second impurity region; therefore, improvement in on current or mobility can be realized.

In this manner, the thin film transistors are completed in the control circuit portion 202 and the memory element region 201. In the control circuit portion 202, a circuit is formed by using the thin film transistors.

Next, in the same manner as in Embodiment Mode 1, the insulating layer 416 is formed so as to cover the conductive layer 415. The insulating layer 416 may be formed using an inorganic material, an organic material, or the like which has an insulating property, and may have a single-layer structure or a stacked-layer structure. An inorganic material or an organic material similar to those of the first insulating layer 414a, the second insulating layer 414b, and the third insulating layer 414c can be used.

Figure 14A:
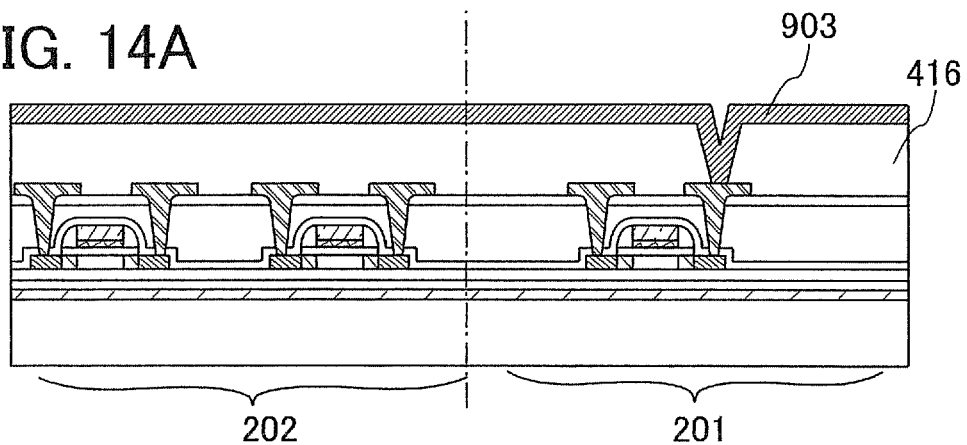
FIGS. 14A to 14C are views showing a manufacturing step of a semiconductor device of Embodiment Mode 5.

After that, as shown in FIG. 14A, a contact hole is formed in the insulating layer 416 so as to expose the conductive layer 415, and the conductive layer 903 is formed so as to fill the contact hole. The conductive layer 903 includes a film formed of an element selected from aluminum (Al), titanium (Ti), molybdenum (Mo), and tungsten (W), an alloy film including such elements, an alloy film including such elements and silicon, or the like. Alternatively, the conductive layer 903 may be formed by using a light transmitting material such as indium tin oxide (ITO), indium tin oxide containing silicon oxide, or indium oxide containing 2 to 20% of zinc oxide. In FIG. 14A, titanium is used for the conductive layer 903.

Figure 14B:
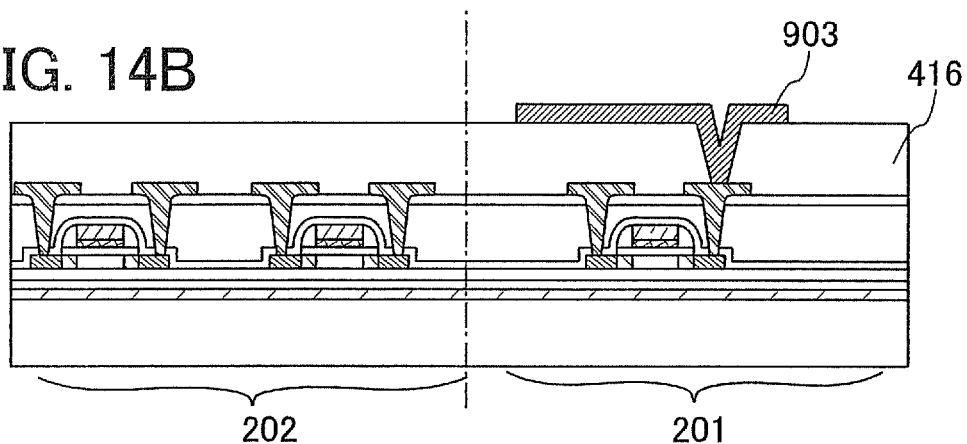
Figure 14C:
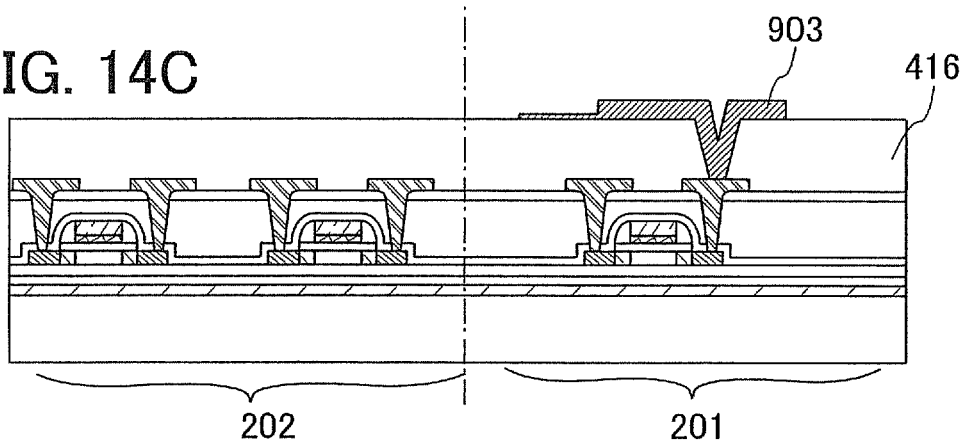

Next, the conductive layer 903 is processed into a desired shape. It is considered that the higher a step is, the lower a breakdown voltage of the memory element is; therefore, by providing two steps each having different height using the lower electrode, two memories having a different breakdown voltage of the memory element can be formed. First, as shown in FIG. 14B, the conductive layer 903 is processed, and then, a part of the conductive layer 903 is further processed as shown in FIG. 14C. Technique such as half etching is used for processing the conductive layer 903. In this manner, the conductive layer 903 can be provided with two steps having different height. The conductive layer 903 can function as the lower electrode of the memory element and also as the step for adjusting the breakdown voltage of the memory element. Further, when a light exposure method using a light exposure mask including a semi-transmission portion, which is referred to as a half-tone light exposure method, is used, the conductive layer 903 can be processed in a short time. Alternatively, a photo mask or a reticle each of which is provided with an auxiliary pattern having a light intensity reducing function, which is formed of a diffraction grating pattern, may be applied to a photolithography step for forming the conductive layer 903.

Figure 15A:
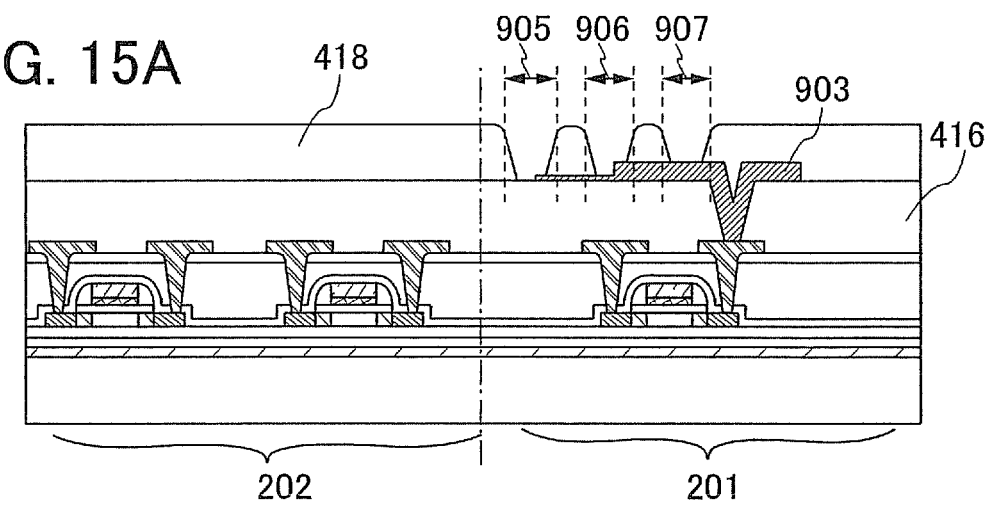
FIGS. 15A and 15B are views showing a manufacturing step of a semiconductor device of Embodiment Mode 5.

Next, as shown in FIG. 15A, an insulating layer is formed so as to cover the conductive layer 903, and a plurality of openings are provided. The partition wall 418 provided with the openings 905, 906, and 907 is formed.

As described above, a plurality of openings and the conductive layer having a plurality of steps can be formed.

Note that although this embodiment mode shows the case where the lower electrode of the memory element is formed of the conductive layer 903, the conductive layer 415 to be a source electrode or a drain electrode of a thin film transistor may be used in common for the lower electrode of the memory element.

Figure 15B:
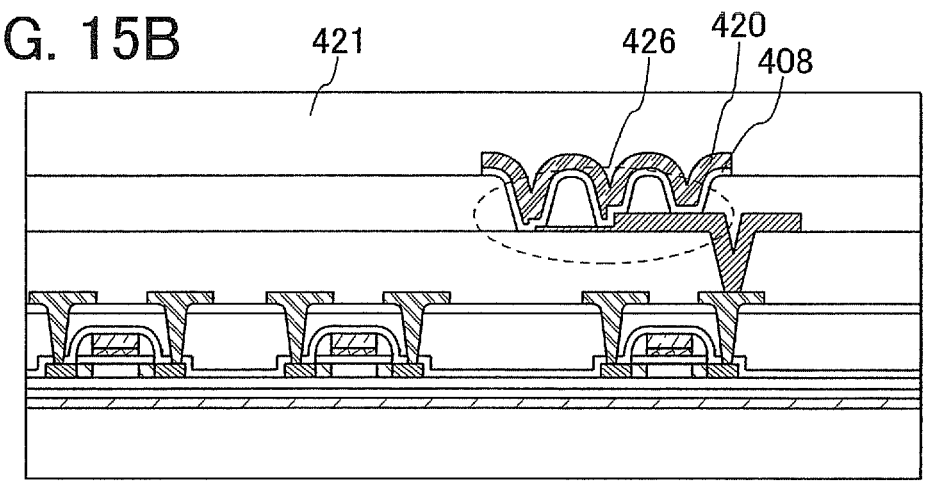

Next, as shown in FIG. 15B, the material layer 408 of the memory element is formed in the opening of the partition wall. The material layer 408 of the memory element can be formed by a vapor deposition method, a spin coating method, or a droplet discharging method typified by an ink-jet method.

Since the material layer 408 of the memory element can also be formed using the same material as the electroluminescent layer included in the light emitting element, the memory element and the light emitting element can be formed over the same substrate through a common step. That is, a memory device having a display function can be formed.

Next, the conductive layer to be the opposite electrode 420 is formed. Since the opposite electrode 420 can be formed over the whole surface of the memory element region, patterning by a photolithography method is not required. Needless to say, the opposite electrode 420 may be selectively formed by patterning. The opposite electrode 420 can function as the upper electrode of the memory element.

Thus, the memory element 426 including the conductive layer 417, the material layer 408 of the memory element, and the opposite electrode 420 is formed. In one memory cell, three memory elements corresponding to the three openings 905, 906, and 907 are formed, and this memory cell has three voltage values by which electric resistance is changed.

In this manner, in the invention, a memory cell can be multivalued in one memory cell. Thus, storage capacity of a memory device can be increased.

In addition, according to Embodiment Mode 1, an antenna for supplying power or the like to the memory element 426 can be provided. The antenna can be formed to be connected to the thin film transistor provided in the memory element region 201 and is formed of a conductive material, preferably a low-resistance material such as Cu (copper), Ag (silver), or Al (aluminum).

Although a semiconductor device including the memory element region and the antenna can be completed through the aforementioned steps, the glass substrate 401 may be peeled off later in the steps shown in Embodiment Mode 1.

Then, a flexible resin substrate may be attached instead of the peeled glass substrate 401.

As a result of peeling off the glass substrate 401 in this manner, reduction in thickness and weight of a semiconductor device including the memory element can be achieved and flexibility and impact resistance thereof can be improved.

Note that this embodiment mode can be freely implemented in combination with Embodiment Mode 1, 2, 3, or 4.

Embodiment Mode 6

Figure 16A:
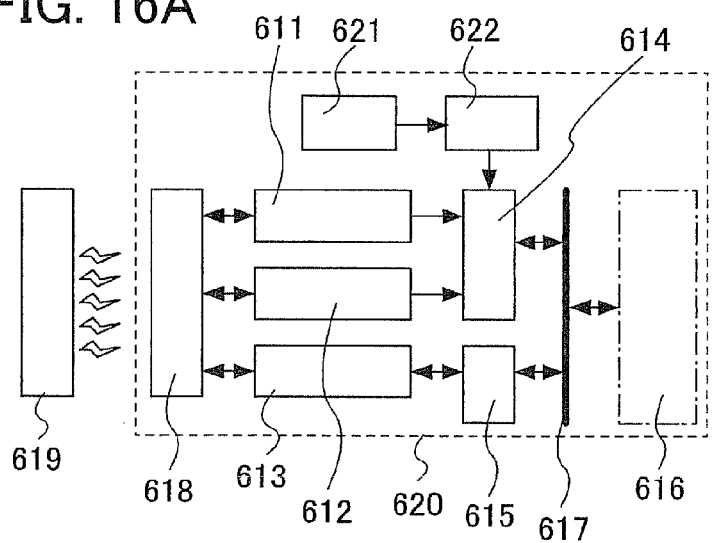
FIG. 16A shows a structure example of a semiconductor device of the invention.

A structure of a semiconductor device in this embodiment mode is described with reference to FIG. 16A. As shown in FIG. 16A, a semiconductor device 620 of the invention has a function of communicating data without contact, and includes a power supply circuit 611, a clock generation circuit 612, a data demodulation/modulation circuit 613, a control circuit 614 for controlling other circuits, an interface circuit 615, a storage circuit 616 including a plurality of memory cells which can store multivalued information, a data bus 617, an antenna (antenna coil) 618, a sensor 621, and a sensor circuit 622.

The power supply circuit 611 generates various kinds of power supplies, which are supplied to each circuit in the semiconductor device 620, in accordance with an alternating current signal input from the antenna 618. The clock generation circuit 612 generates various kinds of clock signals, which are supplied to each circuit in the semiconductor device 620, in accordance with an alternating current signal input from the antenna 618. The data demodulation/modulation circuit 613 has a function of demodulating/modulating data communicated with a reader/writer 619. The control circuit 614 has a function of controlling the memory circuit 616 including a plurality of memory cells which can store multivalued information. The antenna 618 has a function of transmitting/receiving electromagnetic fields or electric waves. The reader/writer 619 communicates with and controls the semiconductor device, and controls a process with regard to the data of the semiconductor device. Note that the structure of the semiconductor device is not limited to the above structure, and for example, other elements such as a limiter circuit of a power supply voltage and hardware dedicated to encryption may be additionally provided.

The memory circuit 616 including a plurality of memory cells which can store multivalued information has a memory element where an insulating layer which is changed by an external electric action is interposed between a pair of conductive layers. Note that the memory circuit 616 including a plurality of memory cells which can store multivalued information may have only the memory element where an insulating layer is interposed between a pair of conductive layers, or may have a memory circuit with a different structure. The memory circuit with a different structure corresponds to one or more selected from a DRAM, an SRAM, a mask ROM, a PROM, an EPROM, an EEPROM, and a flash memory, for example.

A sensor 621 is formed using a semiconductor element such as a resistor element, a capacitive coupling element, an inductive coupling element, a photovoltaic element, a photoelectric conversion element, a thermoelectric element, a transistor, a thermistor, or a diode. The sensor circuit 622 detects changes in impedance, reactance, inductance, voltage, or current, and performs analog/digital conversion (A/D conversion) to output a signal to the control circuit 614.

Figure 16B:
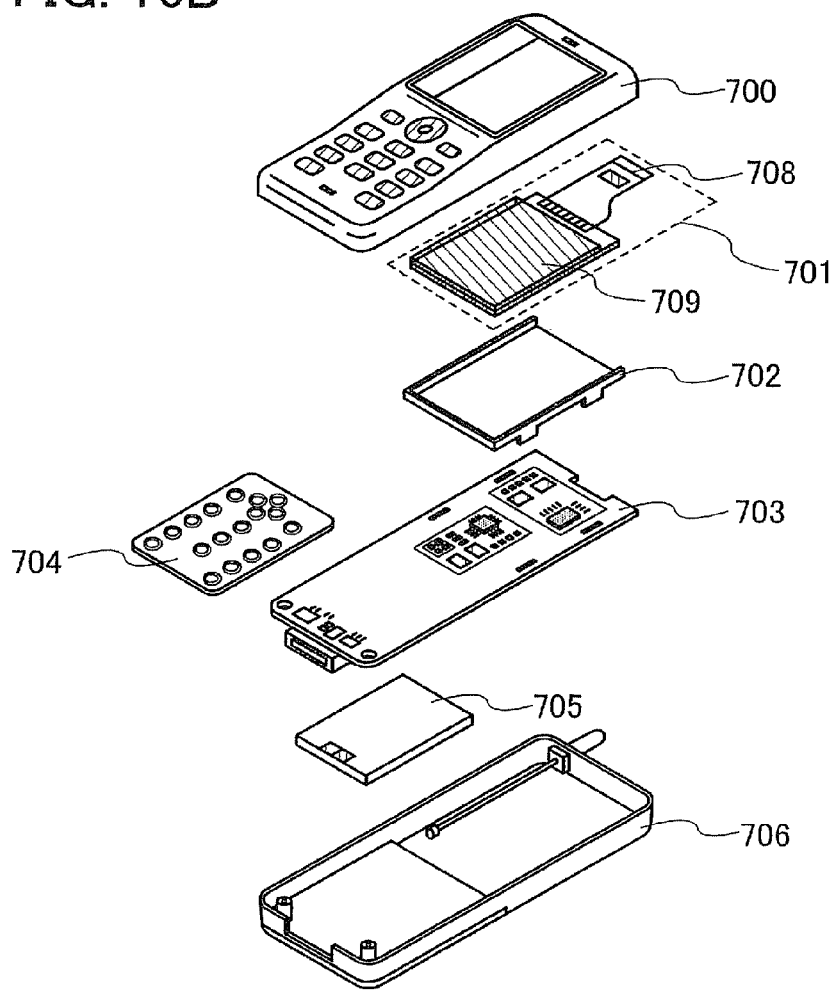
FIG. 16B is a view showing an electronic apparatus including a semiconductor device of the invention.

Next, one mode of an electronic apparatus on which the semiconductor device of the invention is mounted is described with reference to drawings. The electronic apparatus shown here is a portable phone including chassis 700 and 706, a panel 701, a housing 702, a printed wiring board 703, an operation switch 704, and a battery 705 (see FIG. 16B). The panel 701 is detachably incorporated in the housing 702. The housing 702 is fitted into the printed wiring board 703. A shape and dimension of the housing 702 are changed as appropriate in accordance with the electronic apparatus in which the panel 701 is incorporated. On the printed wiring board 703, a plurality of packaged semiconductor devices are mounted, and the semiconductor device of the invention can be used as one of them. A plurality of semiconductor devices mounted on the printed wiring board 703 has any one of functions of a controller, a central processing unit (CPU), a memory, a power supply circuit, an audio processing circuit, a transmitting/receiving circuit, and the like.

The panel 701 is fixedly connected with the printed wiring board 703 through a connection film 708. The panel 701, the housing 702, and the printed wiring board 703 described above are placed in the chassis 700 and 706 together with the operation switch 704 and the battery 705. A pixel region 709 included in the panel 701 is provided so as to be observed through an opening window provided in the chassis 700.

As described above, the semiconductor device of the invention is small, thin, and lightweight, and thereby the limited space in the chassis 700 and 706 of the electronic apparatus can be used efficiently.

In addition, since the semiconductor device of the invention uses a memory element having a simple structure in which an insulating layer which is changed by an external electric action (namely, a layer including an organic compound interposed between a pair of electrodes), as a memory included in the semiconductor device, is interposed between a pair of conductive layers, an electronic apparatus using an inexpensive semiconductor device can be provided. Further, since the semiconductor device of the invention includes a plurality of memory cells which can store multivalued information and high integration of the semiconductor device is easy, an electronic apparatus using a semiconductor device including a storage circuit of which capacity per unit area is large can be provided.

Note that the chassis 700 and 706 are shown as an example of an exterior of the mobile phone, and the electronic apparatus according to this embodiment mode can be changed variously in accordance with the function or the intended purpose thereof.

Figure 17A:
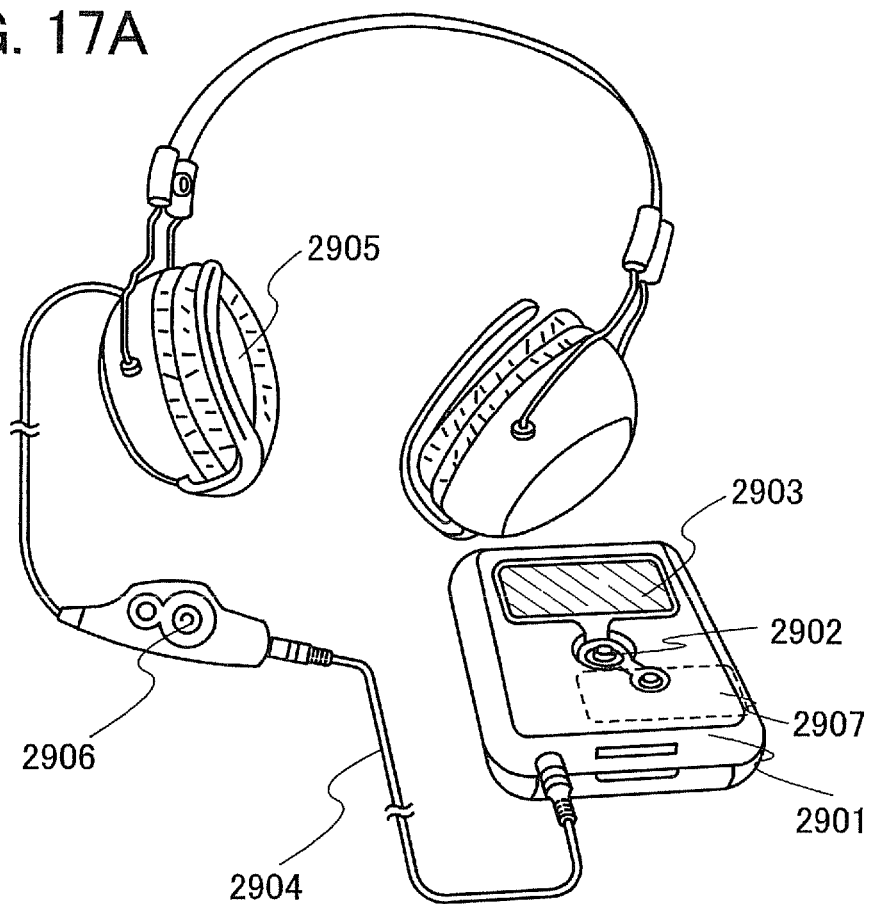
FIGS. 17A and 17B are views showing an electronic apparatus including a semiconductor device of the invention.

In addition, another mode of an electronic device including a semiconductor device of the invention is described with reference to FIG. 17A. The electronic apparatus shown here is a mobile music reproduction device equipped with a recording medium, which includes a main body 2901, a display portion 2903, a recording medium 2907 (a card type memory, a compact large capacity memory, or the like) reading portion, operation keys 2902 and 2906, a speaker portion 2905 of a headphone connected to a connection cord 2904, and the like. Since the semiconductor device of the invention includes a plurality of memory cells which can store multivalued information and high integration of the semiconductor device is easy, a storage circuit of which capacity per unit area is large can be applied to the recording medium 2907 and a lightweight music reproduction device can be achieved. Further, since a memory and an antenna can be formed over the same substrate, the antenna is integrated in the recording medium 2907 and thus the music reproduction device can be made smaller. By integrating the antenna, the mobile music reproduction device can perform wireless communication with a reader/writer device.

Figure 17B:
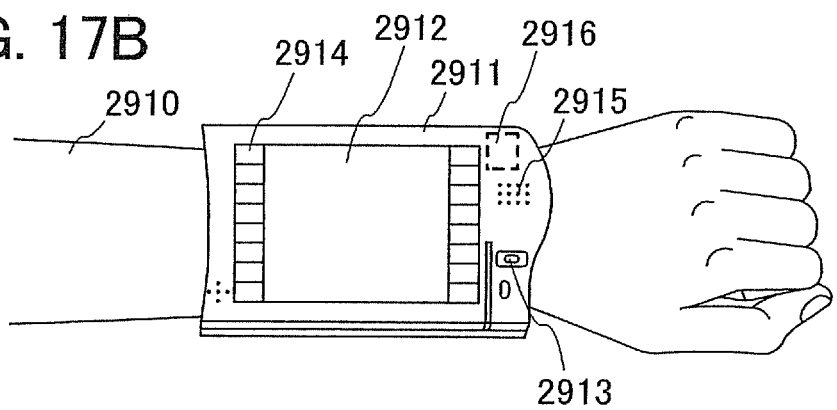

In addition, another mode of an electronic apparatus including a semiconductor device of the invention is described with reference to FIG. 17B. The electronic apparatus shown here is a portable computer which can be worn around an arm, which includes a main body 2911, a display portion 2912, a switch 2913, an operation key 2914, a speaker portion 2915, a semiconductor integrated circuit 2916, and the like. Various input or operation can be performed by the display portion 2902 which serves as a touch panel. Further, although not shown here, this portable computer is provided with a cooling function for suppressing the increase of its temperature, an infrared port, and a communication function such as a high-frequency circuit.

A portion which touches a human arm is preferably covered with a film such as plastic so that he/she does not feel uncomfortable even when it touches a human arm 2910. Accordingly, it is preferable to form the semiconductor integrated circuit 2916 (a memory, a CPU, or the like) and the display portion 2912 over a plastic substrate. Further, an external shape of the main body 2911 may be curved along the human arm 2910. The invention can store multivalued information, and a storage circuit of which capacity per unit area is large is formed over a flexible resin substrate so as to be used as a part of the semiconductor integrated circuit 2916, so that a flexible portable computer can be achieved.

Further, a storage circuit of the invention is applied to the semiconductor integrated circuit 2916 (a memory, a CPU, a high-frequency circuit, or the like), which is included in the portable computer, a control circuit of the speaker portion 2915, and the like; therefore, mounted components of the portable computer can be reduced. For example, by forming a memory and an antenna over the same substrate as shown in Embodiment Mode 1, the portable computer can perform wireless communication with a reader/writer device. Since manufacturing cost can be reduced by using a storage circuit including a plurality of memory cells which can store multi-valued information, of which capacity per unit area is large, a portable computer can be provided at low cost.

Note that this embodiment mode can be freely implemented in combination with Embodiment Mode 1, 2, 3, 4, or 5.

Embodiment Mode 7

Figure 18A:
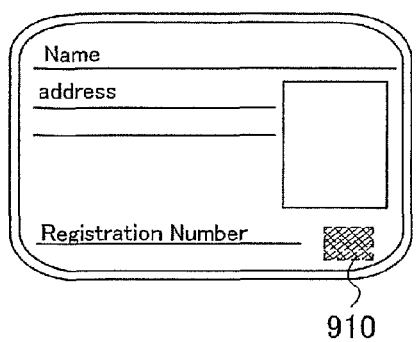
FIGS. 18A to 18F are views showing usage of a semiconductor device of the invention.
Figure 18B:
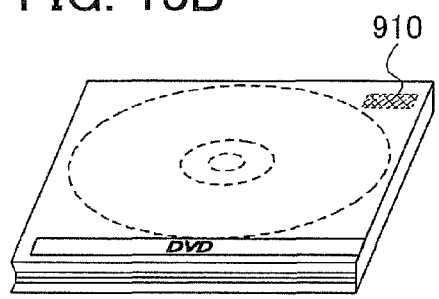
Figure 18C:
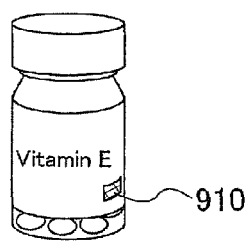
Figure 18D:
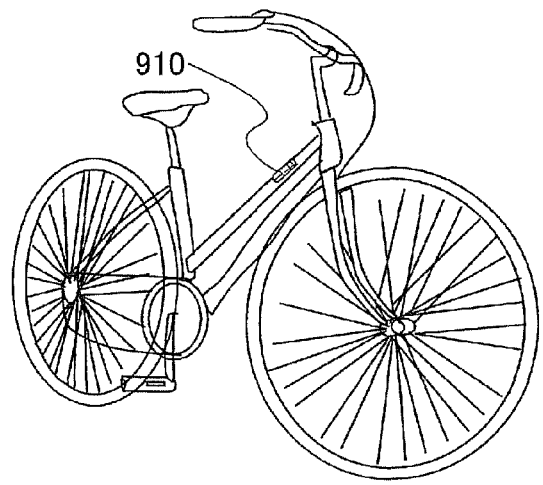
Figure 18E:
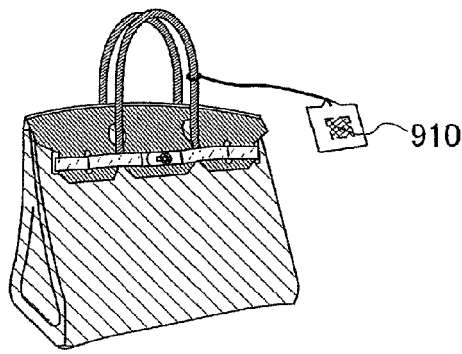
Figure 18F:
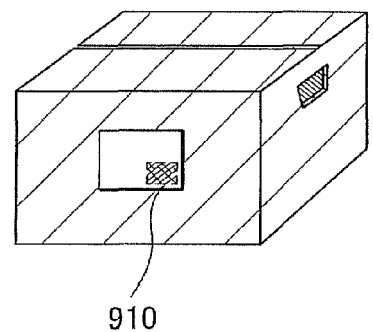

According to the invention, a semiconductor device including a plurality of memory cells which can store multivalued information and functioning as a radio chip can be formed. The radio chip can be applied to various uses such as bills, coins, securities, bearer bonds, documents (such as driver's licenses or resident's cards, see FIG. 18A), packaging containers (such as wrapping paper or bottles, see FIG. 18C), storage media (such as DVD software or video tapes, see FIG. 18B), vehicles (such as bicycles, see FIG. 18D), personal belongings (such as bags or glasses), foods, plants, animals, human bodies, clothing, everyday articles, tags on goods such as electronic apparatus or on packs (see FIGS. 18E and 18F). Note that an electronic apparatus includes a liquid crystal display device, an EL display device, a television set (also simply called as a TV set, a TV receiver, or a television receiver), a mobile phone, and the like.

A semiconductor device 910 of the invention is fixed to a product by being mounted on a printed substrate, attached to a surface of the product, embedded inside the product, or the like. For example, if the product is a book, the semiconductor device 910 is embedded in paper, and if the product is a package made from an organic resin, the semiconductor device 910 is embedded in the organic resin. Since the semiconductor device 910 of the invention can have a small size, a thin shape, and light weight, the design quality of the product itself is not degraded even after the semiconductor device is fixed to the product. By providing the semiconductor device 910 in bills, coins, securities, bearer bonds, documents, and the like, a certification function can be provided and forgery can be prevented through use of the certification function. Further, when the semiconductor device of the invention is provided in packaging containers, storage media, personal belongings, foods, plants, clothing, everyday articles, electronic apparatuses, and the like, systems such as an inspection system can be more efficient.

Note that this embodiment mode can be freely implemented in combination with Embodiment Mode 1, 2, 3, 4, 5, or 6.

In the invention, an electrode of a memory element is precisely processed; therefore, variation of a writing voltage or a reading voltage of a plurality of memory cells can be reduced, and high yield can be achieved in a mass production line.

This application is based on Japanese Patent Application serial No. 2006-047057 filed in Japan Patent Office on Feb. 23, 2006, the entire contents of which are hereby incorporated by reference.

What is claimed is:

1. A semiconductor device including at least one memory cell, the memory cell comprising:
   a first storage element, a second storage element, and a third storage element,
   a first electrode, a second electrode, and a material layer between the first electrode and the second electrode,
   wherein the first electrode, the second electrode, and the material layer between the first electrode and the second electrode are included in the first storage element, the second storage element, and the third storage element,
   wherein the first electrode has a stacked-layer structure including a bottom layer and a top layer, and
   wherein a taper angle of a side surface of the top layer is different from a taper angle of a side surface of the bottom layer.

2. The semiconductor device according to claim 1, wherein storage capacities per unit area of the first storage element, the second storage element, and the third storage element are different from one another.

3. The semiconductor device according to claim 1, wherein, in each of the first, second, third storage elements, an electrical resistance changes due to an application of a voltage thereto, and
   wherein a voltage value at which the voltage changes in the first storage element is different from those in the second and third storage elements.

4. A semiconductor device including at least one memory cell, the memory cell comprising:
   a first storage element, a second storage element, and a third storage element,
   a first electrode, a second electrode, and a material layer between the first electrode and the second electrode,
   wherein the first electrode, the second electrode, and the material layer between the first electrode and the second electrode are included in the first storage element, the second storage element, and the third storage element,
   wherein the first electrode has a stacked-layer structure including a bottom layer and a top layer,
   wherein an end portion of the bottom layer extends beyond an end portion of the top layer,
   wherein in the first storage element, an end portion of the bottom layer, the material layer, and the second electrode are overlapped,
   wherein in the second storage element, the bottom layer, an end portion of the top layer, the material layer, and the second electrode are overlapped, and
   wherein in the third storage element, the bottom layer, the top layer, the material layer, and the second electrode are overlapped.

5. The semiconductor device according to claim 4, wherein storage capacities per unit area of the first storage element, the second storage element, and the third storage element are different from one another.

6. The semiconductor device according to claim 4, wherein taper angle of a side surface of the top layer is different from that of the bottom layer.

7. The semiconductor device according to claim 4, wherein, in each of the first, second, and third storage elements, an electrical resistance changes due to an application of a voltage thereto, and wherein a voltage value at which the voltage changes in the first storage element is different from those in the second and third storage elements.

8. A semiconductor device comprising:
a first storage element and a second storage element,
a first electrode, a second electrode, and a material layer between the first electrode and the second electrode,
wherein the first electrode, the second electrode, and the material layer between the first electrode and the second electrode are included in the first storage element and the second storage element,
wherein the first electrode has a stacked-layer structure including a bottom layer and a top layer, and
wherein a taper angle of a side surface of the top layer is different from a taper angle of a side surface of the bottom layer.

9. The semiconductor device according to claim 8, wherein storage capacities per unit area of the first storage element and the second storage element are different from each other.

10. The semiconductor device according to claim 8, wherein storage capacities per unit area of the first storage element and the second storage element are different from each other.

11. A semiconductor device comprising:
a first storage element and a second storage element,
a first electrode, a second electrode, and a material layer between the first electrode and the second electrode,
wherein the first electrode, the second electrode, and the material layer between the first electrode and the second electrode are included in the first storage element and the second storage element,
wherein in the first storage element, an end portion of the first electrode, the material layer, and the second electrode are overlapped, and
wherein in the second storage element, the first electrode, the material layer, and the second electrode are overlapped.

12. The semiconductor device according to claim 11, wherein, in each of the first storage element and the second storage element, an electrical resistance changes due to an application of a voltage thereto, and
wherein a voltage value at which the voltage changes in the first storage element is different from that in the second storage element.

13. The semiconductor device according to claim 11, wherein, in each of the first storage element and the second storage element, an electrical resistance changes due to an application of a voltage thereto, and
wherein a voltage value at which the voltage changes in the first storage element is different from that in the second storage element.

* * * * *